United States Patent
Watanabe et al.

(10) Patent No.: US 11,825,220 B2
(45) Date of Patent: Nov. 21, 2023

(54) OPERATION METHOD OF IMAGING DEVICE

(71) Applicant: Semiconductor Energy Laboratory Co., Ltd., Atsugi (JP)

(72) Inventors: Kazunori Watanabe, Machida (JP); Susumu Kawashima, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 481 days.

(21) Appl. No.: 17/261,664

(22) PCT Filed: Jul. 24, 2019

(86) PCT No.: PCT/IB2019/056306
§ 371 (c)(1),
(2) Date: Jan. 20, 2021

(87) PCT Pub. No.: WO2020/026080
PCT Pub. Date: Feb. 6, 2020

(65) Prior Publication Data
US 2021/0281777 A1    Sep. 9, 2021

(30) Foreign Application Priority Data
Aug. 3, 2018 (JP) .................. 2018-146486

(51) Int. Cl.
*H04N 25/57* (2023.01)
*H01L 27/146* (2006.01)
(Continued)

(52) U.S. Cl.
CPC ....... *H04N 25/57* (2023.01); *H01L 27/14616* (2013.01); *H01L 29/24* (2013.01);
(Continued)

(58) Field of Classification Search
CPC .......... H01L 27/1225; H01L 27/14612; H01L 27/14616; H01L 27/14636;
(Continued)

(56) References Cited

U.S. PATENT DOCUMENTS 8,378,391 B2    2/2013   Koyama et al.
8,482,974 B2 *  7/2013   Saito .................... G11C 11/405
                                                   365/177
(Continued)

FOREIGN PATENT DOCUMENTS

CN    102598269 A    7/2012
CN    106463521 A    2/2017
(Continued)

OTHER PUBLICATIONS

International Search Report (Application No. PCT/IB2019/056306) dated Oct. 15, 2019.
(Continued)

*Primary Examiner* — Amy R Hsu
(74) *Attorney, Agent, or Firm* — ROBINSON INTELLECTUAL PROPERTY LAW OFFICE; Eric J. Robinson

(57) ABSTRACT

An imaging device including a miniaturized pixel is provided. A pixel is provided with a photoelectric conversion element, a first transistor, a second transistor, and a capacitor. One electrode of the photoelectric conversion element is electrically connected to one of a source and a drain of the first transistor. The other of the source and the drain of the first transistor is electrically connected to a gate of the second transistor. The gate of the second transistor is electrically connected to one electrode of the capacitor. In a first period, a first potential is supplied to the other electrode of the capacitor and the first transistor is set in an on state so that imaging data corresponding to illuminance of light
(Continued)

delivered to the photoelectric conversion element is written to the pixel. Furthermore, in a second period, a second potential is supplied to the other electrode of the capacitor so that the imaging data is read from the pixel.

10 Claims, 16 Drawing Sheets

(51) Int. Cl.
  *H01L 29/24* (2006.01)
  *H01L 29/786* (2006.01)
  *H04N 25/772* (2023.01)

(52) U.S. Cl.
  CPC .... *H01L 29/7869* (2013.01); *H01L 29/78648* (2013.01); *H04N 25/772* (2023.01)

(58) Field of Classification Search
  CPC ............... H01L 27/14665; H01L 29/24; H01L 29/78648; H01L 29/7869; H01L 29/78696; H04N 25/57; H04N 25/77; H04N 25/772
  See application file for complete search history.

(56) References Cited

U.S. PATENT DOCUMENTS

| | | | |
|---|---|---|---|
| 8,916,869 B2 | 12/2014 | Koyama et al. | |
| 9,331,112 B2 | 5/2016 | Koyama et al. | |
| 9,773,814 B2 | 9/2017 | Koyama et al. | |
| 9,773,835 B2 | 9/2017 | Kato et al. | |
| 9,865,643 B2 | 1/2018 | Kato et al. | |
| 10,128,300 B2 | 11/2018 | Kato et al. | |
| 10,134,797 B2 | 11/2018 | Kato et al. | |
| 10,389,961 B2 | 8/2019 | Kurokawa | |
| 10,498,980 B2 | 12/2019 | Ohmaru | |
| 10,741,605 B2 | 8/2020 | Kato et al. | |
| 11,233,958 B2* | 1/2022 | Satou | H04N 25/59 |
| 2008/0225061 A1* | 9/2008 | Kimura | G09G 3/3233 345/690 |
| 2011/0108836 A1 | 5/2011 | Koyama et al. | |
| 2014/0226401 A1* | 8/2014 | Yamazaki | G11C 16/0408 365/185.08 |
| 2017/0013214 A1 | 1/2017 | Ohmaru | |
| 2017/0110503 A1 | 4/2017 | Kato et al. | |
| 2018/0019291 A1* | 1/2018 | Morita | H01L 27/124 |

FOREIGN PATENT DOCUMENTS

| | | |
|---|---|---|
| EP | 3051588 A | 8/2016 |
| EP | 3279943 A | 2/2018 |
| EP | 3389093 A | 10/2018 |
| EP | 3637468 A | 4/2020 |
| EP | 3654377 A | 5/2020 |
| JP | 2011-119711 A | 6/2011 |
| JP | 2016-201797 A | 12/2016 |
| JP | 2017-022706 A | 1/2017 |
| KR | 2012-0091294 A | 8/2012 |
| KR | 2017-0134948 A | 12/2017 |
| WO | WO-2011/055626 | 5/2011 |
| WO | WO-2016/158439 | 10/2016 |

OTHER PUBLICATIONS

Written Opinion (Application No. PCT/IB2019/056306) dated Oct. 15, 2019.

* cited by examiner

FIG. 15A1
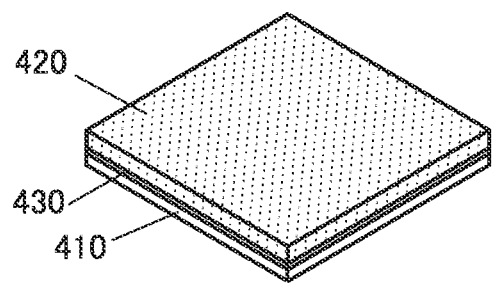
FIG. 15B1
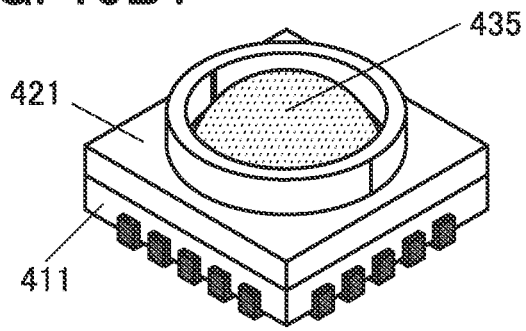
FIG. 15A2
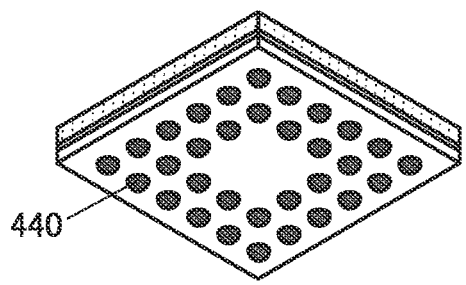
FIG. 15B2
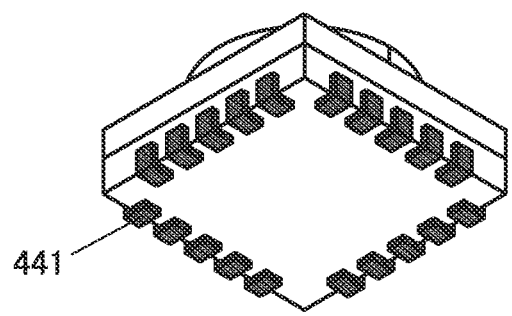
FIG. 15A3
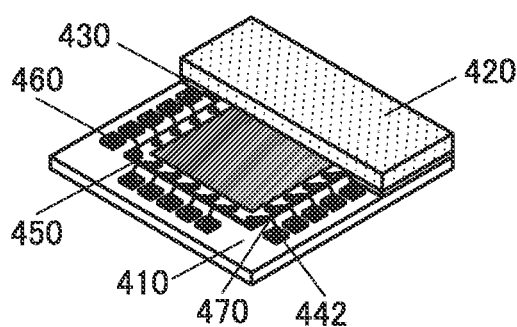
FIG. 15B3
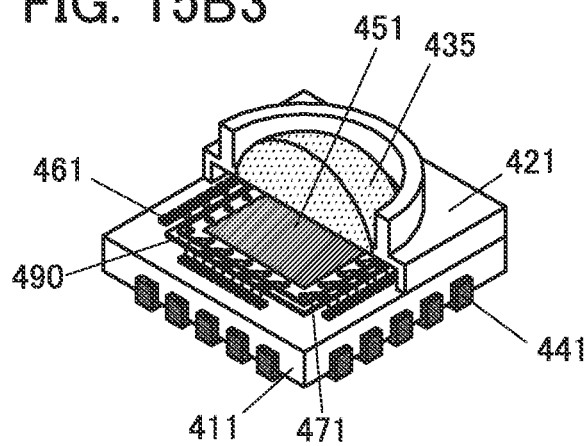

OPERATION METHOD OF IMAGING DEVICE

TECHNICAL FIELD

One embodiment of the present invention relates to an imaging device and an operating method thereof. Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Thus, more specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

Note that in this specification and the like, a semiconductor device generally means a device that can function by utilizing semiconductor characteristics. A transistor and a semiconductor circuit are embodiments of semiconductor devices. In addition, in some cases, a memory device, a display device, an imaging device, or an electronic device includes a semiconductor device.

BACKGROUND ART

A technique for forming a transistor by using an oxide semiconductor thin film formed over a substrate has attracted attention. For example, Patent Document 1 discloses an imaging device with a structure where a transistor including an oxide semiconductor that is a transistor having extremely low off-state current is used in a pixel circuit.

Furthermore, Patent Document 2 discloses an imaging device with miniaturized pixels.

PRIOR ART DOCUMENTS

Patent Documents

[Patent Document 1] Japanese Published Patent Application No. 2011-119711
[Patent Document 2] International Publication No. WO2016/158439

SUMMARY OF THE INVENTION

Problems to be Solved by the Invention

Miniaturization of pixels included in an imaging device enables acquisition of high-resolution imaging data. Meanwhile, particularly in a front-surface irradiation type imaging device, miniaturization of photoelectric conversion elements included in pixels leads to reductions in the light-receiving areas of the photoelectric conversion elements and might decrease the light detection sensitivity of the pixels. In addition, miniaturization of pixels might decrease the amount of electric charge that can be retained in the pixels as imaging data. Therefore, particularly in imaging under a low illuminance condition, the S/N ratio of imaging data decreases in some cases.

Thus, one object of one embodiment of the present invention is to provide an operation method of an imaging device including a miniaturized pixel. Another object is to provide an operation method of an imaging device with a large light-receiving area. Another object is to provide an operation method of an imaging device with high light detection sensitivity. Another object is to provide an operation method of an imaging device with a high S/N ratio. Another object is to provide an operation method of an imaging device that can acquire high-quality imaging data. Another object is to provide an operation method of an imaging device with a high dynamic range. Another object is to provide an operation method of an imaging device that inhibits generation of malfunctions. Another object is to provide an operation method of a highly reliable imaging device. Another object is to provide an operation method of a novel imaging device. Another object is to provide a novel imaging device or the like. Another object is to provide a novel semiconductor device or the like.

Note that the description of these objects does not preclude the existence of other objects. Note that one embodiment of the present invention does not have to achieve all these objects. Note that objects other than these will be apparent from the description of the specification, the drawings, the claims, and the like, and objects other than these can be derived from the description of the specification, the drawings, the claims, and the like.

Means for Solving the Problems

One embodiment of the present invention is an operation method of an imaging device including a pixel. The pixel includes a photoelectric conversion element, a first transistor, a second transistor, and a capacitor. One electrode of the photoelectric conversion element is electrically connected to one of a source and a drain of the first transistor. The other of the source and the drain of the first transistor is electrically connected to a gate of the second transistor. The gate of the second transistor is electrically connected to one electrode of the capacitor. Writing imaging data corresponding to illuminance of light delivered to the photoelectric conversion element to the pixel by supplying a first potential to the other electrode of the capacitor and setting the first transistor in an on state in the first period. Reading the imaging data from the pixel by supplying a second potential to the other electrode of the capacitor in a second period.

Alternatively, in the above embodiment, the second transistor may be in an off state in the first period, and the second transistor may be in an on state in the second period.

Alternatively, in the above embodiment, the second transistor may be an n-channel transistor, and the second potential may be higher than the first potential.

Alternatively, in the above embodiment, the second transistor may be a p-channel transistor, and the second potential may be lower than the first potential.

Another embodiment of the present invention is an operation method of an imaging device including a pixel. The pixel includes a photoelectric conversion element, a first transistor, a second transistor, a third transistor, and a capacitor. One electrode of the photoelectric conversion element is electrically connected to one of a source and a drain of the first transistor. The other of the source and drain of the first transistor is electrically connected to a gate of the second transistor. The gate of the second transistor is electrically connected to one of a source and a drain of the third transistor. The one of the source and the drain of the third transistor is electrically connected to one electrode of the capacitor. Resetting a gate potential of the second transistor by setting the third transistor in an on state in a first period. Writing imaging data corresponding to illuminance of light delivered to the photoelectric conversion element to the pixel by supplying a first potential to the other electrode of the capacitor and setting the first transistor in an on state and the third transistor in an off state in a second period. Reading the imaging data from the pixel by supplying a second potential to the other electrode of the capacitor in a third period.

Alternatively, in the above embodiment, the second transistor may be in an off state in the first and second periods, and the second transistor may be in an on state in the third period.

Alternatively, in the above embodiment, the second transistor may be an n-channel transistor, and the second potential may be higher than the first potential.

Alternatively, in the above embodiment, the second transistor may be a p-channel transistor, and the second potential may be lower than the first potential.

Alternatively, in the above embodiment, the first transistor may include a metal oxide in a channel formation region, and the metal oxide may include In, Zn, and M (M is Al, Ti, Ga, Sn, Y, Zr, La, Ce, Nd, or Hf).

Effect of the Invention

The use of one embodiment of the present invention can provide an operation method of an imaging device including a miniaturized pixel. Alternatively, an operation method of an imaging device with a large light-receiving area can be provided. Alternatively, an operation method of an imaging device with high light detection sensitivity can be provided. Alternatively, an operation method of an imaging device with a high S/N ratio can be provided. Alternatively, an operation method of an imaging device that can acquire high-quality imaging data can be provided. Alternatively, an operation method of an imaging device with a high dynamic range can be provided. Alternatively, an operation method of an imaging device that inhibits generation of malfunctions can be provided. Alternatively, an operation method of a highly reliable imaging device can be provided. Alternatively, an operation method of a novel imaging device can be provided. Alternatively, a novel imaging device or the like can be provided. Alternatively, a novel semiconductor device or the like can be provided.

BRIEF DESCRIPTION OF THE DRAWINGS

FIG. 15(A1) to FIG. 15(A3) and FIG. 15(B1) to FIG. 15(B3) are perspective views illustrating structure examples of a package and a module in each of which an imaging device is placed.

MODE FOR CARRYING OUT THE INVENTION

Figure 1A:
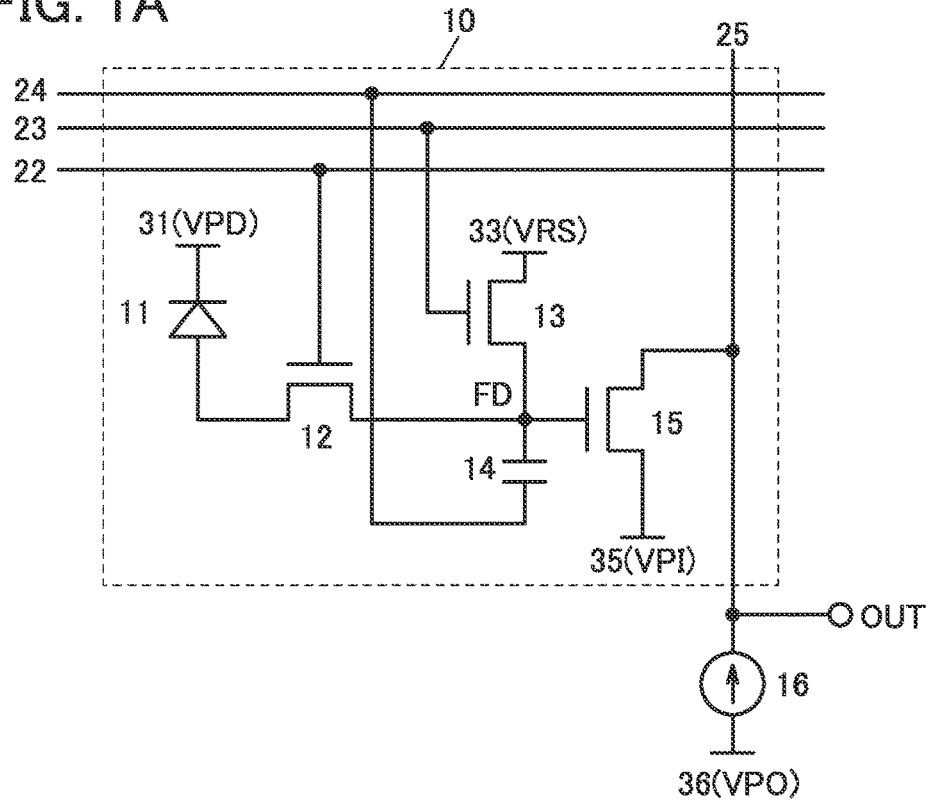
FIG. 1(A) is a diagram illustrating a configuration example of a pixel.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In addition, a plurality of embodiments described below can be combined as appropriate. Furthermore, in the case where a plurality of structure examples are described in one embodiment, the structure examples can be combined with each other as appropriate.

Note that in the drawings attached to this specification, the block diagram in which components are classified according to their functions and shown as independent blocks is illustrated; however, it is difficult to separate actual components completely according to their functions, and it is possible for one component to relate to a plurality of functions.

In addition, in the drawings and the like, the size, the layer thickness, the region, or the like is exaggerated for clarity in some cases. Therefore, the size, the layer thickness, the region, or the like is not limited to the illustrated scale. The drawings schematically illustrate ideal examples, and embodiments of the present invention are not limited to shapes, values, and the like shown in the drawings.

Moreover, in the drawings and the like, the same elements, elements having similar functions, elements formed of the same material, elements formed at the same time, or the like are sometimes denoted by the same reference numerals, and repeated description thereof is omitted in some cases.

Furthermore, in this specification and the like, the term "film" and the term "layer" can be interchanged with each other. For example, the term "conductive layer" can be changed into the term "conductive film" in some cases. Alternatively, for example, the term "insulating film" can be changed into the term "insulating layer" in some cases.

In addition, in this specification and the like, terms for describing arrangement, such as "over" and "below," do not necessarily mean "directly over" and "directly below," respectively, in the positional relationship between components. For example, the expression "a gate electrode over a gate insulating layer" does not exclude the case where there is another component between the gate insulating layer and the gate electrode.

Furthermore, in this specification and the like, ordinal numbers such as "first," "second," and "third" are used in order to avoid confusion among components, and the terms do not limit the components numerically.

Furthermore, in this specification and the like, "electrically connected" includes the case where connection is made through an "object having any electric action." Here, there is no particular limitation on the "object having any electric action" as long as electric signals can be transmitted and received between the connected components. Examples of the "object having any electric action" include a switching element such as a transistor, a resistor, an inductor, a capacitor, and other elements with a variety of functions as well as an electrode and a wiring.

Moreover, in this specification and the like, "voltage" often refers to a potential difference between a given potential and a reference potential (e.g., a ground potential). Thus, voltage and a potential difference can be interchanged with each other. Note that the term "voltage" is sometimes used to simply mean a "potential." In addition, the term "potential" is sometimes used to mean a potential difference from a given potential (a reference potential, a ground potential, or the like). Therefore, the term "potential" and the term "voltage" can be interchanged with each other in some cases.

In addition, in this specification and the like, a transistor is an element having at least three terminals of a gate, a drain, and a source. The transistor includes a channel formation region between a drain (a drain terminal, a drain region, or a drain electrode) and a source (a source terminal, a source region, or a source electrode), and current can flow between the source and the drain through the channel formation region. Note that in this specification and the like, a channel formation region refers to a region through which current mainly flows.

Furthermore, the function of a source and the function of a drain are sometimes interchanged with each other when a transistor of different polarity is employed or the direction of current is changed in circuit operation, for example. Therefore, the term "source" and the term "drain" can be used interchangeably in this specification and the like.

In addition, unless otherwise specified, off-state current in this specification and the like refers to drain current of a transistor in an off state (also referred to as a non-conducting state or a cutoff state). Furthermore, in the description of off-state current, a drain may be replaced with a source. That is, the off-state current sometimes refers to source current when a transistor in an off state. In addition, leakage current sometimes expresses the same meaning as off-state current. Furthermore, in this specification and the like, the off-state current sometimes refers to current that flows between a source and a drain when a transistor is in an off state.

Furthermore, in this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is called an oxide semiconductor in some cases. That is, when a metal oxide has at least one of amplifying action, rectifying action, and switching action, the metal oxide can be called a metal oxide semiconductor. In other words, a transistor containing a metal oxide in a channel formation region can be referred to as an "oxide semiconductor transistor" or an "OS transistor."

In addition, in this specification and the like, a metal oxide containing nitrogen is also referred to as a metal oxide in some cases. Furthermore, a metal oxide containing nitrogen may be referred to as a metal oxynitride. The details of a metal oxide will be described later.

Embodiment 1

In this embodiment, an imaging device that is one embodiment of the present invention and an operation method thereof will be described.

One embodiment of the present invention is an operation method of an imaging device provided with a pixel that does not include a selection transistor. The pixel includes an amplifier transistor that has a function of amplifying written imaging data when the imaging data is read and a capacitor that has a function of retaining the written imaging data as electric charge. A gate of the amplifier transistor is electrically connected to one electrode of the capacitor.

In the operation method of the imaging device of one embodiment of the present invention, potentials supplied to the other electrode of the capacitor vary between a period in which the imaging data is written to the pixel and a period in which the imaging data is read from the pixel. Specifically, potentials supplied to the other electrode of the capacitor are adjusted so that the amplifier transistor is set in an off state in the period in which the imaging data is written to the pixel and the amplifier transistor is set in an on state in the period in which the imaging data is read from the pixel. Accordingly, even when the pixel is not provided with a selection transistor, the imaging device can operate correctly.

In this specification and the like, in an n-channel transistor, for example, a state where gate-source voltage Vgs is lower than the threshold voltage is referred to as an off state, and a state where the gate-source voltage Vgs is higher than or equal to the threshold voltage is referred to as an on state. In addition, in a p-channel transistor, for example, a state where the gate-source voltage Vgs is higher than the threshold voltage is referred to as an off state, and a state where the gate-source voltage Vgs is lower than or equal to the threshold voltage is referred to as an on state.

The number of transistors provided in the pixel can be reduced when the pixel is not provided with a selection transistor; thus, the pixel can be miniaturized. In addition, particularly in the case where the imaging device of one embodiment of the present invention is a front-surface irradiation type imaging device, the light-receiving area of a photoelectric conversion element provided in the pixel can be increased, so that the light detection sensitivity of the pixel can be increased. Furthermore, the occupation area of the capacitor, the amplifier transistor, and the like provided in the pixel can be increased; thus, the amount of electric charge that can be retained as imaging data can be increased. Accordingly, an S/N ratio can be increased while the pixel is miniaturized. Consequently, the imaging device of one embodiment of the present invention can acquire high-quality imaging data.

Pixel Configuration Example 1

FIG. 1(A) is a diagram illustrating a configuration example of a pixel 10 that can be used for the imaging device of one embodiment of the present invention. The pixel 10 includes a photoelectric conversion element 11, a transistor 12, a transistor 13, a capacitor 14, and a transistor 15. Here, all of the transistor 12, the transistor 13, and the transistor 15 can be n-channel transistors. In addition, for convenience of description, FIG. 1(A) illustrates a current source 16 that is not included in the pixel 10. Note that other diagrams illustrating configuration examples of the pixel 10 also illustrate the current source 16 that is not included in the pixel 10.

One electrode (an anode in FIG. 1(A)) of the photoelectric conversion element 11 is electrically connected to one of a source and a drain of the transistor 12. The other of the source and the drain of the transistor 12 is electrically connected to one of a source and a drain of the transistor 13. The one of the source and the drain of the transistor 13 is electrically connected to one electrode of the capacitor 14. The one electrode of the capacitor 14 is electrically connected to a gate of the transistor 15.

Here, a wiring where the other of the source and the drain of the transistor 12, the one of the source and the drain of the transistor 13, the one electrode of the capacitor 14, and the gate of the transistor 15 are connected is referred to as a node FD.

A gate of the transistor 12 is electrically connected to a wiring 22. A gate of the transistor 13 is electrically connected to a wiring 23. The other electrode of the capacitor 14 is electrically connected to a wiring 24. One of a source and a drain of the transistor 15 is electrically connected to a wiring 25. The wiring 25 is electrically connected to one electrode of the current source 16.

The other electrode (a cathode in FIG. 1(A)) of the photoelectric conversion element 11 is electrically connected to a wiring 31. The other of the source and the drain of the transistor 13 is electrically connected to a wiring 33. The other of the source and the drain of the transistor 15 is electrically connected to a wiring 35. The other electrode of the current source 16 is electrically connected to a wiring 36.

The wiring 22 and the wiring 23 each have a function of a gate line. A signal that controls the on/off of the transistor 12 is supplied to the transistor 12 through the wiring 22, and a signal that controls the on/off of the transistor 13 is supplied to the transistor 13 through the wiring 23. The wiring 24 has a function of a signal line, and a signal is supplied to the other electrode of the capacitor 14 through the wiring 24. The wiring 25 has a function of a data line, and imaging data written to the pixel 10 is output to the outside of the pixel 10 through the wiring 25 as a signal OUT.

The wiring 31, the wiring 35, and the wiring 36 each have a function of a power supply line. For example, a constant potential can be supplied to each of the wiring 31, the wiring 35, and the wiring 36. Here, a potential supplied to the wiring 31 is referred to as a potential VPD, a potential supplied to the wiring 35 is referred to as a potential VPI, and a potential supplied to the wiring 36 is referred to as a potential VPO. The potential VPD can be a high potential, for example.

In this specification and the like, a low potential can be a ground potential or a negative potential, for example. In addition, a high potential can be a potential higher than a low potential, for example, a positive potential. Note that a low potential may be a positive potential, and a high potential may be a positive potential higher than the low potential.

The wiring 33 has a function of a reset power supply line, and a potential VRS that is a reset potential can be supplied to the wiring 33. The potential VRS can be a potential lower than the potential VPD, for example, a negative potential.

As the photoelectric conversion element 11, a photodiode can be used. When light is delivered to the photoelectric conversion element 11, electric charge corresponding to the illuminance of the light is accumulated.

The transistor 12 has a function of a transfer transistor that controls transfer of the electric charge accumulated in the photoelectric conversion element 11 to the node FD by exposing the photoelectric conversion element 11 to light. By setting the transistor 12 in an on state, the electric charge accumulated in the photoelectric conversion element 11 is transferred to the node FD. Thus, the potential of the node FD is set to a potential corresponding to the illuminance of light delivered to the photoelectric conversion element 11, and imaging data is written to the pixel 10. After that, the transistor 12 is set in an off state, so that the electric charge is retained in the node FD. Accordingly, the imaging data written to the pixel 10 is retained.

The transistor 13 has a function of a reset transistor that controls resetting the potential of the node FD. When the transistor 12 and the transistor 13 are set in on states before exposure of the photoelectric conversion element 11 to light is started, the electric charge accumulated in the photoelectric conversion element 11 and the node FD can be reset. Accordingly, the potential of the node FD can be reset. Specifically, the potential of the node FD can be reset to the potential VRS, for example.

The capacitor 14 has a function of retaining electric charge or the like that is transferred from the photoelectric conversion element 11 to the node FD. The transistor 15 has a function of an amplifier transistor that amplifies the imaging data retained in the pixel 10 and reads the amplified imaging data to the outside of the pixel 10.

The current source 16 has a function of setting current flowing through the wiring 25 to a constant value. The current source 16 can be composed of a transistor, for example. In the case where the current source 16 is a transistor, one of a source and a drain of the transistor can be electrically connected to the wiring 25, and the other of the source and the drain of the transistor can be electrically connected to the wiring 36. In addition, a bias potential can be supplied to a gate of the transistor, and it can be said that the transistor has a function of a bias transistor.

As described above, a constant potential is supplied to each of the wiring 35 and the wiring 36. Thus, it can be said that the transistor 15 and the current source 16 form a source-grounded amplifier circuit or a source follower circuit. Here, in the pixel 10 with the configuration illustrated in FIG. 1(A), the transistor 15 is an n-channel transistor. Thus, it can be said that a source-grounded amplifier circuit is formed when the potential VPI is lower than the potential VPO and a source follower circuit is formed when the potential VPI is higher than the potential VPO. For example, in the case where the potential VPI is a low potential and the potential VPO is a high potential, it can be said that the transistor 15 and the current source 16 form a source-grounded amplifier circuit. Alternatively, in the case where the potential VPI is a high potential and the potential VPO is a low potential, it can be said that the transistor 15 and the current source 16 form a source follower circuit.

Note that in the current source 16 illustrated in FIG. 1(A), the direction of current flowing through the current source 16 when the transistor 15 and the current source 16 form a source-grounded amplifier circuit is indicated by an arrow. Also in other drawings, in the current source, the direction of current flowing through the current source when the current source and an amplifier transistor form a source-grounded amplifier circuit is indicated by an arrow.

On the assumption that the transistor 15 is an n-channel transistor as illustrated in FIG. 1(A), in the case where the transistor 15 and the current source 16 form a source-grounded amplifier circuit and the gate voltage of the transistor 15, that is, a potential VFD of the node FD is higher than or equal to a potential "VPI+Vth," the transistor 15 is set in an on state and the potential of the wiring 25 is set to a potential "VFD+Vth." In addition, in the case where the transistor 15 and the current source 16 form a source follower circuit and the gate voltage of the transistor 15 is higher than or equal to a potential "VPO+Vth+VCSN," the transistor 15 is set in an on state and the potential of the wiring 25 is set to a potential "VFD−Vth." Here, the potential Vth refers to the threshold voltage of the transistor 15. Furthermore, on the assumption that the transistor 15 is an n-channel transistor, current flows through the current source 16 in the case where the transistor 15 and the current source 16 form a source follower circuit and a difference between the potential of the one electrode of the current source 16 and the potential of the other electrode of the current source 16 is higher than or equal to the potential VCSN.

In the case where the transistor 15 and the current source 16 form a source-grounded amplifier circuit, the pixel 10 can operate at high speed. In contrast, in the case where the transistor 15 and the current source 16 form a source follower circuit, the potential of the signal OUT can be highly accurate.

As illustrated in FIG. 1(A), the pixel 10 has a function of selecting the pixel 10 from which imaging data is read, and is not provided with a selection transistor that can be provided so that whose one of a source and a drain is electrically connected to one electrode of the source and the drain of the transistor 15 and whose the other of the source and the drain is electrically connected to the wiring 25, for example. Thus, the one of the source and the drain of the transistor 15 that has a function of an amplifier transistor is electrically connected to the wiring that has a function of a data line, and the other of the source and the drain of the transistor 15 is electrically connected to the wiring 35 that has a function of a power supply line.

Here, the use of a transistor whose off-state current is extremely low as each of the transistor 12 and the transistor 13 enables extremely long-term retention of electric charge in the node FD. Thus, the imaging data written to the pixel 10 can be retained for an extremely long period. Consequently, although details will be described later, a global shutter system in which electric charge accumulation operation is performed in all the pixels at the same time can be employed without a complicated circuit configuration and/or operation method. An OS transistor can be given as an example of a transistor whose off-state current is extremely low.

Note that an OS transistor may be used as the transistor 15. When all the transistors included in the imaging device of one embodiment of the present invention are OS transistors, the imaging device can be manufactured by a simple method.

Alternatively, a given combination of an OS transistor and a transistor using silicon in a channel formation region (hereinafter a Si transistor) may be employed. Alternatively, all the transistors may be Si transistors. Examples of the Si transistor include a transistor containing amorphous silicon, a transistor containing crystalline silicon (typically, low-temperature polysilicon), and a transistor containing single crystal silicon.

Figure 1B:
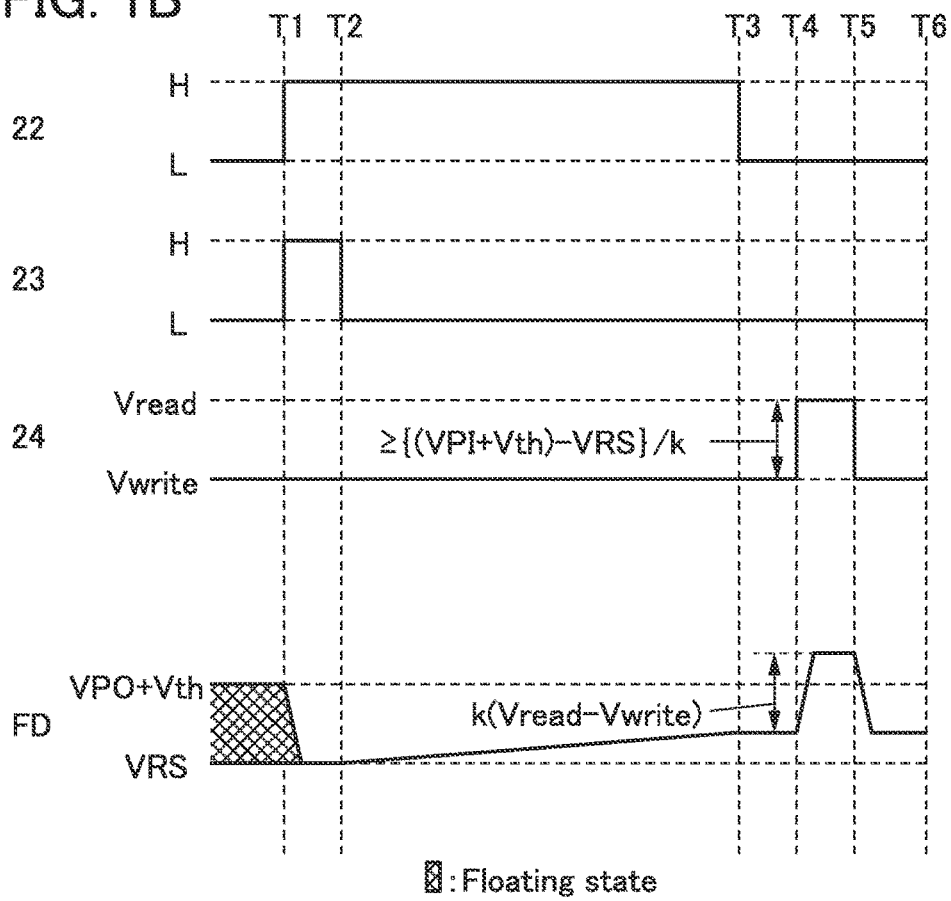
FIG. 1(B) is a diagram showing an operation example of the pixel.

FIG. 1(B) is a timing chart showing an operation example of the pixel 10 with the configuration illustrated in FIG. 1(A). Note that in FIG. 1(B) and the like, "H" means a high potential and "L" means a low potential. In addition, as described above, the potential Vth refers to the threshold voltage of the transistor 15.

Here, the transistor 15 and the current source 16 form a source-grounded amplifier circuit. In addition, the capacitive coupling coefficient of the node FD is k (k is a real number larger than 0 and smaller than or equal to 1). Here, k is calculated from the capacitance of the capacitor 14, the gate capacitance of the transistor 15, parasitic capacitance, and the like.

Furthermore, detailed potential changes caused by a circuit configuration, operation timing, or the like, such as potential distribution, coupling, or loss, are not taken into consideration. Note that these points are similarly applied to timing charts other than that in FIG. 1(B).

In a period from Time T1 to Time T2, when the potentials of the wiring 22 and the wiring 23 are set to high potentials and the potential of the wiring 24 is set to a potential Vwrite, the transistor 12 and the transistor 13 are set in on states, and the potential of the node FD is set to the potential VRS that is a reset potential. Thus, the electric charge accumulated in the photoelectric conversion element 11 and the node FD is reset. Accordingly, the period from Time T1 to Time T2 can be referred to as a reset operation period. Note that the potential Vwrite will be described later.

Here, the potential VRS can be a potential lower than or equal to the potential "VPI+Vth," and the transistor 15 is an n-channel transistor, as described above. Therefore, in the period from Time T1 to Time T2, the transistor 15 is set in an off state.

In a period from Time T2 to Time T3, when the potential of the wiring 22 is set to a high potential and the potential of the wiring 23 is set to a low potential, the transistor 12 is set in an on state and the transistor 13 is set in an off state. This transfers the electric charge accumulated in the photoelectric conversion element 11 to the node FD in accordance with the illuminance of light delivered to the photoelectric conversion element 11. Here, for example, the potential VPD that can be set to a high potential is higher than the potential VRS, and thus the potential of the node FD increases in accordance with the illuminance of light delivered to the photoelectric conversion element 11. Accordingly, imaging data is written to the pixel 10. Consequently, the period from Time T2 to Time T3 can be referred to as a write operation period. Note that the potential of the wiring 24 is set to the potential Vwrite.

In a period from Time T3 to Time T4, when the potentials of the wiring 22 and the wiring 23 are set to low potentials, the transistor 12 and the transistor 13 are set in off states. Then, the write operation is terminated and the potential of the node FD is retained. Thus, the imaging data is retained in the pixel 10. Accordingly, the period from Time T3 to Time T4 can be referred to as a retention operation period. Note that the potential of the wiring 24 is set to the potential Vwrite.

Here, the level of the potential VRS is preferably set such that the transistor 15 is set in an off state regardless of the illuminance of light delivered to the photoelectric conversion element 11 in a period from Time T2 to Time T4. Specifically, the level of the potential VRS is preferably set such that the gate potential of the transistor 15 is lower than the potential "VPI+Vth" even when the maximum assumed illuminance of light delivered to the photoelectric conversion element 11 is delivered to the photoelectric conversion element 11. For example, in the case where the potential VPI is a ground potential, the potential VRS is preferably set to a negative potential. Thus, unintended current can be inhibited from flowing to the wiring 25 through the transistor 15. Accordingly, the malfunction of the imaging device of one embodiment of the present invention can be inhibited.

In a period from Time T4 to Time T5, the potentials of the wiring 22 and the wiring 23 are set to low potentials. Thus, the transistor 12 and the transistor 13 are set in off states. In addition, the potential of the wiring 24 is set to a potential Vread. Here, the potential Vread is a potential higher than the potential Vwrite. Thus, the potential of the node FD is increased by a potential "k(Vread−Vwrite)" due to capacitive coupling, and the transistor 15 is set in an on state. When the transistor 15 is set in an on state, the potential of the wiring 25 that has a function of a data line is set to a potential corresponding to the potential of the node FD. That is, the imaging data retained in the pixel 10 is read. Accordingly, the period from Time T4 to Time T5 can be referred to as a read operation period.

Here, the level of the potential "Vread−Vwrite" is preferably higher than or equal to a potential "{(VPI+Vth)−VRS}/k." Thus, the transistor 15 can be set in an on state regardless of the illuminance of light delivered to the photoelectric conversion element 11. Specifically, the gate potential of the transistor 15 can be higher than or equal to the potential "VPI+Vth" even when the potential of the node FD in the period from Time T3 to Time T4 is the potential VRS; therefore, the transistor 15 can be set in an on state. Accordingly, the imaging data can be read from the pixel 10 correctly even when the illuminance of light delivered to the photoelectric conversion element 11 is low, and the dynamic range of the imaging device of one embodiment of the present invention can be increased.

In a period from Time T5 to Time T6, the potentials of the wiring 22 and the wiring 23 are set to low potentials and the potential of the wiring 24 is set to the potential Vwrite. Then, the transistor 12, the transistor 13, and the transistor 15 are set in off states and the read operation is terminated. The above is the operation example of the pixel 10. Note that as described above, the potential of the wiring 24 is set to the potential Vwrite in the write operation period, and the potential of the wiring 24 is set to the potential Vread in the read operation period. Accordingly, the potential Vwrite can be referred to as a write potential, and the potential Vread can be referred to as a read potential.

Although the pixel 10 does not include a selection transistor as described above, the pixel 10 can be operated by the method shown in FIG. 1(B). The number of transistors provided in the pixel 10 can be reduced with the structure where the pixel 10 does not include a selection transistor; thus, the pixel 10 can be miniaturized. In addition, particularly in the case where the imaging device of one embodiment of the present invention is a front-surface irradiation type imaging device, the light-receiving area of the photoelectric conversion element 11 can be increased, so that the light detection sensitivity of the pixel 10 can be increased. Furthermore, the occupation areas of the capacitor 14, the transistor 15, and the like can be increased, and the amount of electric charge that can be retained in the node FD can be increased. Accordingly, an S/N ratio can be increased while the pixel is miniaturized. Consequently, the imaging device of one embodiment of the present invention can acquire high-quality imaging data.

Pixel Configuration Example 2

Figure 2A:
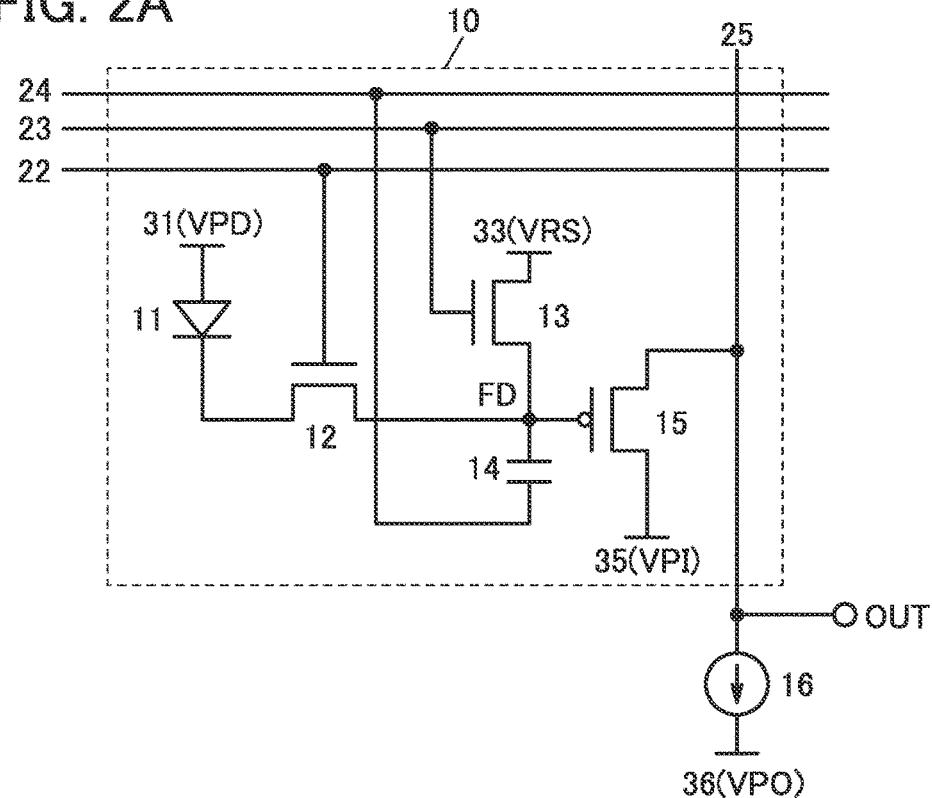
FIG. 2(A) is a diagram illustrating a configuration example of the pixel.

FIG. 2(A) is a diagram illustrating a configuration example of the pixel 10 that is a modification example of the configuration illustrated in FIG. 1(A). The configuration of the pixel 10 illustrated in FIG. 2(A) differs from the configuration of the pixel 10 illustrated in FIG. 1(A) in that the transistor 15 is a p-channel transistor.

In the pixel 10 with the configuration illustrated in FIG. 2(A), the cathode of the photoelectric conversion element 11 can be electrically connected to the one of the source and the drain of the transistor 12, and the anode of the photoelectric conversion element 11 can be electrically connected to the wiring 31. In addition, the potential VPD can be a low potential, for example. Furthermore, the potential VRS can be a potential higher than the potential VPD.

Like the pixel 10 with the configuration illustrated in FIG. 1(A), it can be said that the transistor 15 and the current source 16 form a source-grounded amplifier circuit or a source follower circuit even when the pixel 10 has the configuration illustrated in FIG. 2(A). Here, in the pixel 10 with the configuration illustrated in FIG. 2(A), the transistor 15 is a p-channel transistor. Thus, it can be said that a source-grounded amplifier circuit is formed when the potential VPI is higher than the potential VPO and a source follower circuit is formed when the potential VPI is lower than the potential VPO. For example, in the case where the potential VPI is a high potential and the potential VPO is a low potential, it can be said that the transistor 15 and the current source 16 form a source-grounded amplifier circuit. Alternatively, in the case where the potential VPI is a low potential and the potential VPO is a high potential, it can be said that the transistor 15 and the current source 16 form a source follower circuit.

On the assumption that the transistor 15 is a p-channel transistor as illustrated in FIG. 2(A), in the case where the transistor 15 and the current source 16 form a source-grounded amplifier circuit and the gate voltage of the transistor 15, that is, the potential VFD of the node FD is lower than or equal to the potential "VPI+Vth," the transistor 15 is set in an on state and the potential of the wiring 25 is set to the potential "VFD−Vth." In addition, in the case where the transistor 15 and the current source 16 form a source follower circuit and the gate voltage of the transistor 15 is lower than or equal to a potential "VPO+Vth−VCSP," the transistor 15 is set in an on state and the potential of the wiring 25 is set to the potential "VFD+Vth." Here, on the assumption that the transistor 15 is a p-channel transistor, current flows through the current source 16 in the case where the transistor 15 and the current source 16 form a source follower circuit and a difference between the potential of the one electrode of the current source 16 and the potential of the other electrode of the current source 16 is lower than or equal to the potential VCSP (a difference between the potential of the other electrode of the current source 16 and the potential of the one electrode of the current source 16 is higher than or equal to the potential VCSP).

Figure 2B:
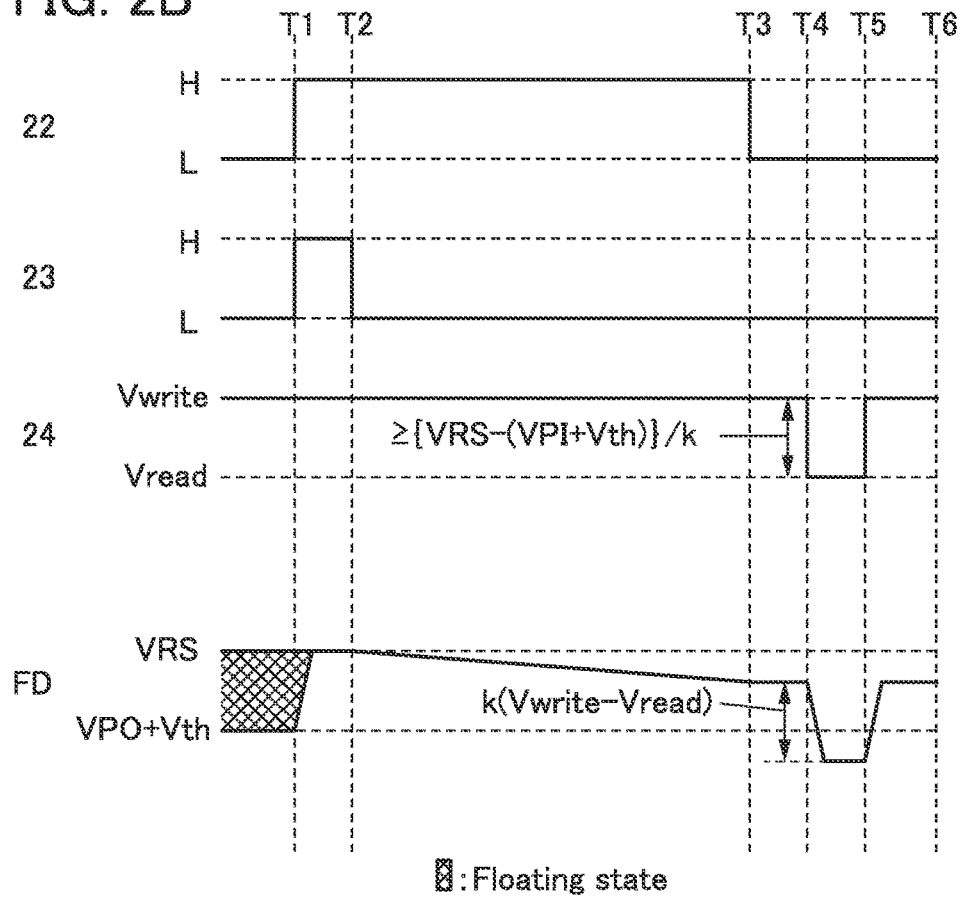
FIG. 2(B) is a diagram showing an operation example of the pixel.

FIG. 2(B) is a timing chart showing an operation example of the pixel 10 with the configuration illustrated in FIG. 2(A).

In a period from Time T1 to Time T2, when the potentials of the wiring 22 and the wiring 23 are set to high potentials, the transistor 12 and the transistor 13 are set in on states, and the potential of the node FD is set to the potential VRS that is a reset potential. Thus, electric charge accumulated in the photoelectric conversion element 11 and the node FD is reset. Here, the potential VRS can be a potential higher than or equal to the potential "VPI+Vth," and the transistor 15 is a p-channel transistor, as described above. Therefore, in the period from Time T1 to Time T2, the transistor 15 is set in an off state. Note that the potential of the wiring 24 is set to the potential Vwrite.

In a period from Time T2 to Time T3, when the potential of the wiring 22 is set to a high potential and the potential of the wiring 23 is set to a low potential, the transistor 12 is set in an on state and the transistor 13 is set in an off state. This transfers the electric charge accumulated in the photoelectric conversion element 11 to the node FD in accordance with the illuminance of light delivered to the photoelectric conversion element 11. Here, for example, the potential VPD that can be set to a low potential is lower than the potential VRS, and thus the potential of the node FD decreases in accordance with the illuminance of light delivered to the photoelectric conversion element 11. Accordingly, imaging data is written to the pixel 10. Note that the potential of the wiring 24 is set to the potential Vwrite.

In a period from Time T3 to Time T4, when the potentials of the wiring 22 and the wiring 23 are set to low potentials, the transistor 12 and the transistor 13 are set in off states. Then, write operation is terminated and the potential of the node FD is retained. Thus, the imaging data is retained in the pixel 10. Note that the potential of the wiring 24 is set to the potential Vwrite.

Here, the level of the potential VRS is preferably set such that the transistor 15 is set in an off state regardless of the illuminance of light delivered to the photoelectric conversion element 11 in a period from Time T2 to Time T4. Specifically, the level of the potential VRS is preferably set such that the gate potential of the transistor 15 is higher than the potential "VPI+Vth" even when the maximum assumed illuminance of light delivered to the photoelectric conversion element 11 is delivered to the photoelectric conversion element 11. Thus, unintended current can be inhibited from flowing to the wiring 25 through the transistor 15. Accordingly, the malfunction of the imaging device of one embodiment of the present invention can be inhibited.

In a period from Time T4 to Time T5, the potentials of the wiring 22 and the wiring 23 are set to low potentials. Thus, the transistor 12 and the transistor 13 are set in off states. In addition, the potential of the wiring 24 is set to the potential Vread. Here, the potential Vread is a potential lower than the potential Vwrite. Thus, the potential of the node FD is decreased by a potential "k(Vwrite−Vread)" due to capacitive coupling, and the transistor 15 is set in an on state. When the transistor 15 is set in an on state, the potential of the wiring 25 that has a function of a data line is set to a potential corresponding to the potential of the node FD. That is, the imaging data retained in the pixel 10 is read.

Here, the level of the potential "Vwrite−Vread" is preferably higher than or equal to a potential "{VRS−(VPI+Vth)}/k." Thus, the transistor 15 can be set in an on state regardless of the illuminance of light delivered to the photoelectric conversion element 11. Specifically, the gate potential of the transistor 15 can be lower than or equal to the potential "VPI+Vth" even when the potential of the node FD in the period from Time T3 to Time T4 is the potential VRS; therefore, the transistor 15 can be set in an on state. Accordingly, the imaging data can be read from the pixel 10 correctly even when the illuminance of light delivered to the photoelectric conversion element 11 is low, and the dynamic range of the imaging device of one embodiment of the present invention can be increased.

In a period from Time T5 to Time T6, the potentials of the wiring 22 and the wiring 23 are set to low potentials and the potential of the wiring 24 is set to the potential Vwrite. Then, the transistor 12, the transistor 13, and the transistor 15 are set in off states and read operation is terminated. The above is the operation example of the pixel 10 with the configuration illustrated in FIG. 2(A).

Note that in either the pixel 10 with the configuration illustrated in FIG. 1(A) or the pixel 10 with the configuration illustrated in FIG. 2(A), one or both of the transistor 12 and the transistor 13 may be p-channel transistors. In addition, also in the pixels 10 with configurations illustrated in the following drawings, one or both of the transistor 12 and the transistor 13 may be p-channel transistors. Even in such a case, FIG. 1(B), FIG. 2(B), and the like can be referred to for the operation of the pixel 10 by, for example, switching the potential magnitude relationship as needed.

Configuration Example 1 of Imaging Device

Figure 3:
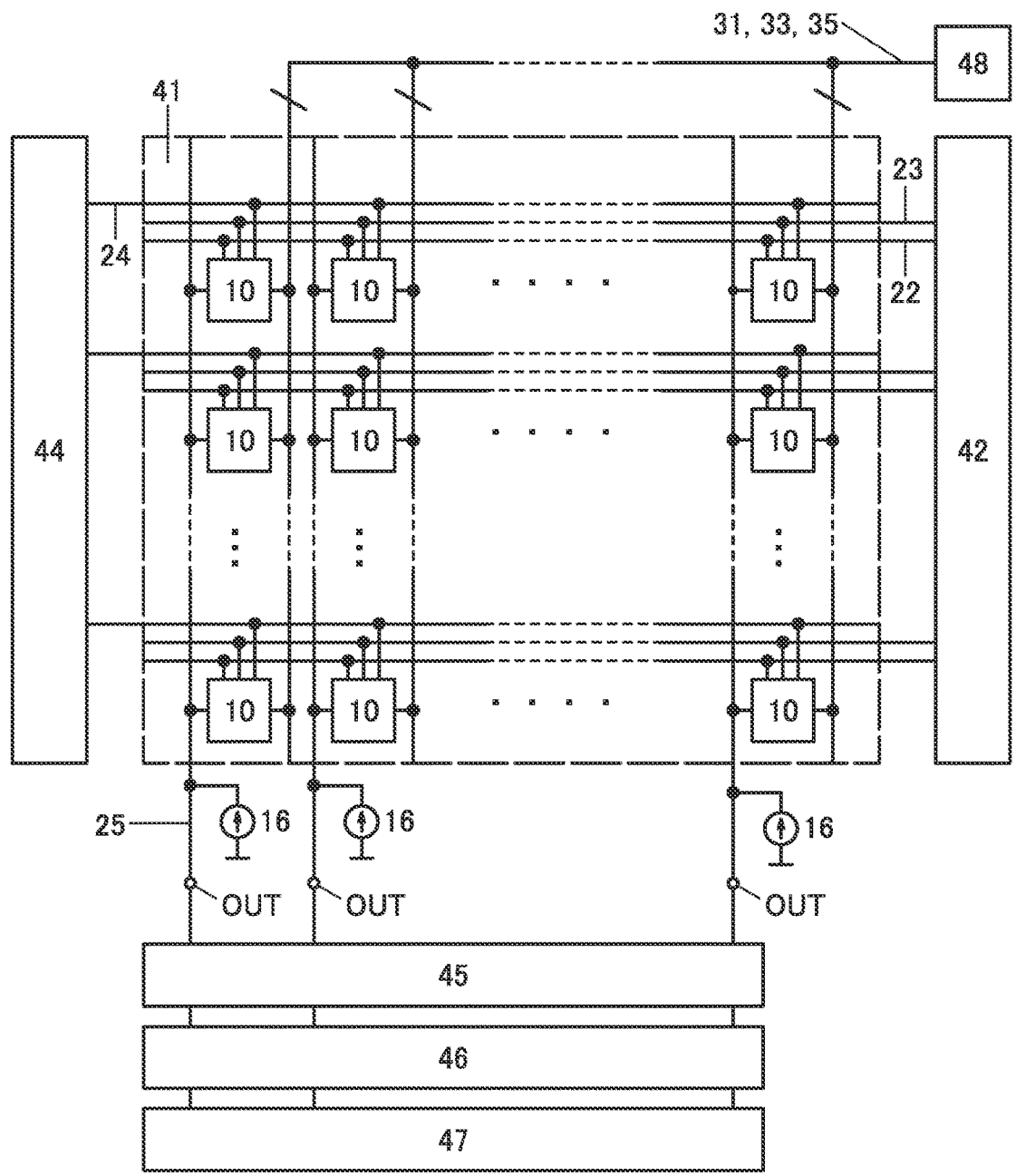
FIG. 3 is a diagram illustrating a configuration example of an imaging device.

FIG. 3 is a block diagram illustrating a configuration example of an imaging device of one embodiment of the present invention. The imaging device includes an imaging portion 41, a signal generation circuit 44, a gate driver circuit 42, a CDS circuit 45, a data driver circuit 46, an A/D converter circuit 47, and a power supply circuit 48. In addition, in the imaging portion 41, the pixels 10 are arranged in a matrix.

As described above, the wiring 25 is electrically connected to the one electrode of the current source 16. For example, a structure where one wiring 25 is electrically connected to one current source 16 may be employed. Note that in the case where the pixel 10 has the configuration illustrated in FIG. 2(A), the direction of current flowing through the current source 16 is opposite to a direction indicated by an arrow in FIG. 3.

The signal generation circuit 44 is electrically connected to the pixels 10 through the wiring 24 that has a function of a signal line. For example, a structure where the pixels 10 in one row are electrically connected to the signal generation circuit 44 through one wiring 24 can be employed.

The gate driver circuit 42 is electrically connected to the pixels 10 through the wiring 22 and the wiring 23 that have functions of gate lines. For example, a structure where the pixels in one row are electrically connected to the gate driver circuit 42 through one wiring 22 and one wiring 23 can be employed.

The CDS circuit 45 is electrically connected to the pixels 10 through the wiring 25 that has a function of a data line. For example, a structure where the pixels 10 in one column are electrically connected to the CDS circuit 45 through one wiring 25 can be employed.

The data driver circuit 46 is electrically connected to the CDS circuit 45, and the A/D converter circuit 47 is electrically connected to the data driver circuit 46.

The power supply circuit 48 is electrically connected to the pixels 10 through the wiring 31 and the wiring 35 that have functions of power supply lines and the wiring 33 that has a function of a reset power supply line. For example, a structure where all the pixels 10 are electrically connected to the power supply circuit 48 through one wiring 31, one wiring 33, and one wiring 35 can be employed.

The signal generation circuit 44 has a function of generating the potential Vwrite and the potential Vread. That is, the signal generation circuit 44 has a function of generating a write signal to be supplied to the pixel 10 when the pixel 10 performs write operation and a read signal to be supplied to the pixel 10 when the pixel 10 performs read operation.

The gate driver circuit 42 has a function of generating a signal that controls the on/off of the transistor 12 and a signal that controls the on/off of the transistor 13. For example, on the assumption that the transistor 12 is an n-channel transistor, in the case where the transistor 12 is set in an on state, the gate driver circuit 42 can generate a high-potential signal and can supply the signal to the transistor 12.

In the imaging device with the configuration illustrated in FIG. 3, a circuit having a function of generating the potential Vwrite and the potential Vread is different from a circuit having a function of generating signals that control the on/off of the transistor 12 and the transistor 13. Thus, the potential Vwrite and the potential Vread can be different from the potentials of the signals that control the on/off of the transistor 12 and the transistor 13. For example, even in the case where the gate driver circuit 42 does not have a function of generating a negative potential, the potential Vwrite or the potential Vread can be a negative potential. Consequently, compared to the case where the circuit having a function of generating the potential Vwrite and the potential Vread is the same as the circuit having a function of generating the signals that control the on/off of the transistor 12 and the transistor 13, a difference between the potential Vwrite and the potential Vread can be made large, for example. Accordingly, it is possible to broaden the dynamic range of the imaging device of one embodiment of the present invention.

The CDS circuit 45 has a function of reducing imaging data noise by performing correlated double sampling or the like on the signal OUT that is imaging data output from the pixel 10. The data driver circuit 46 has a function of selecting a column of the pixels 10 from which retained imaging data is to be read. The A/D converter circuit 47 has a function of converting imaging data that is analog data into digital data. The power supply circuit 48 has a function of generating the potential VPD, the potential VRS, and the potential VPI.

Configuration Example 2 of Imaging Device

Figure 4:
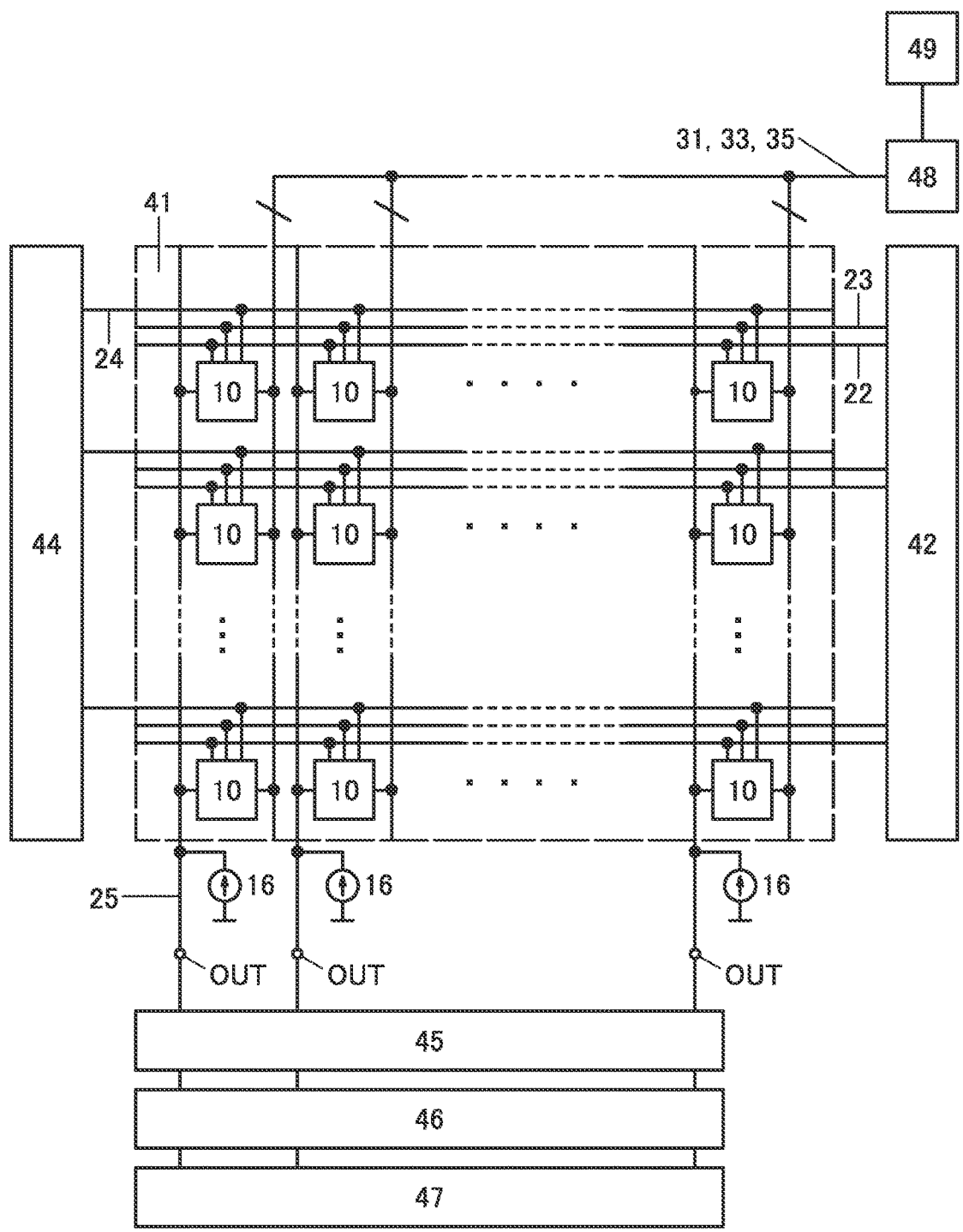
FIG. 4 is a diagram illustrating a configuration example of an imaging device.

FIG. 4 is a block diagram illustrating a configuration example of an imaging device of one embodiment of the present invention that is a modification example of the configuration illustrated in FIG. 3. The configuration of the imaging device illustrated in FIG. 4 differs from the configuration of the imaging device illustrated in FIG. 3 in that an optical sensor 49 is provided.

The optical sensor 49 is electrically connected to the power supply circuit 48. The optical sensor 49 has a function of detecting the illuminance of external light. The optical sensor 49 can include an element with a configuration similar to that of the photoelectric conversion element 11.

When the imaging device has the configuration illustrated in FIG. 4, the potential VRS that is a reset potential can be changed in accordance with the illuminance of external light. For example, in the case where the pixel 10 has the configuration illustrated in FIG. 1(A), the potential VRS can be increased with low illuminance of external light, that is, in a dark environment, and the potential VRS can be decreased with high illuminance of external light, that is, in a bright environment. In addition, for example, in the case where the pixel 10 has the configuration illustrated in FIG. 2(A), the potential VRS can be decreased in a dark environment, and the potential VRS can be increased in a bright environment. Accordingly, crushed blacks and blown-out highlights can be suppressed, and the dynamic range of the imaging device of one embodiment of the present invention can be increased.

Figure 5:
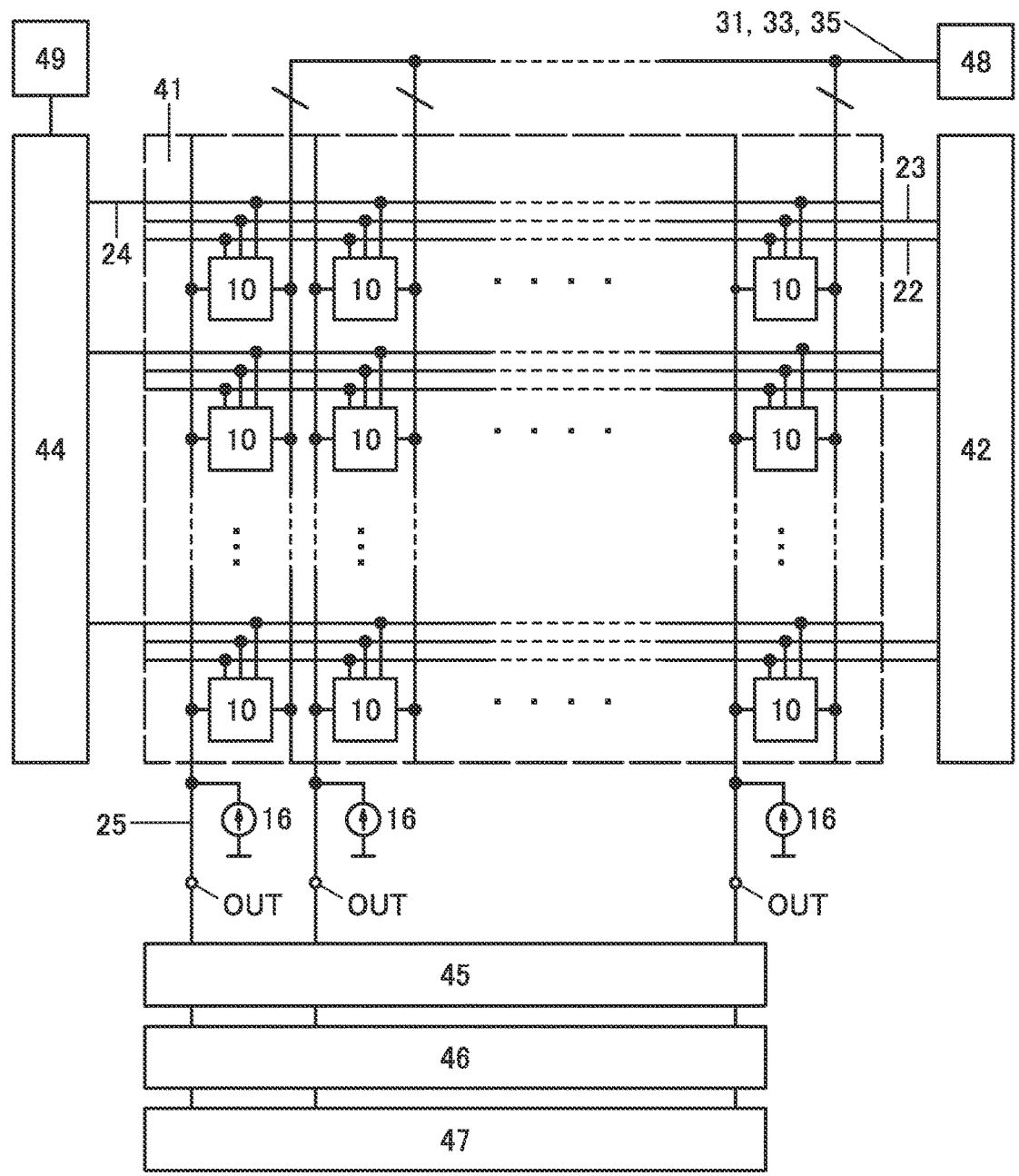
FIG. 5 is a diagram illustrating a configuration example of an imaging device.

FIG. 5 is a block diagram illustrating a configuration example of an imaging device of one embodiment of the present invention that is a modification example of the configuration illustrated in FIG. 4. The configuration of the imaging device illustrated in FIG. 5 differs from the configuration of the imaging device illustrated in FIG. 4 in that the optical sensor 49 is electrically connected to the signal generation circuit 44.

When the imaging device has the configuration illustrated in FIG. 5, the potential Vwrite and/or the potential Vread can be changed in accordance with the illuminance of external light. For example, a difference between the potential Vread and the potential Vwrite can be increased in a dark environment, and the difference between the potential Vread and the potential Vwrite can be decreased in a bright environment. Accordingly, crushed blacks and blown-out highlights can be suppressed, and the dynamic range of the imaging device of one embodiment of the present invention can be increased.

Configuration Example 3 of Imaging Device

Figure 6:
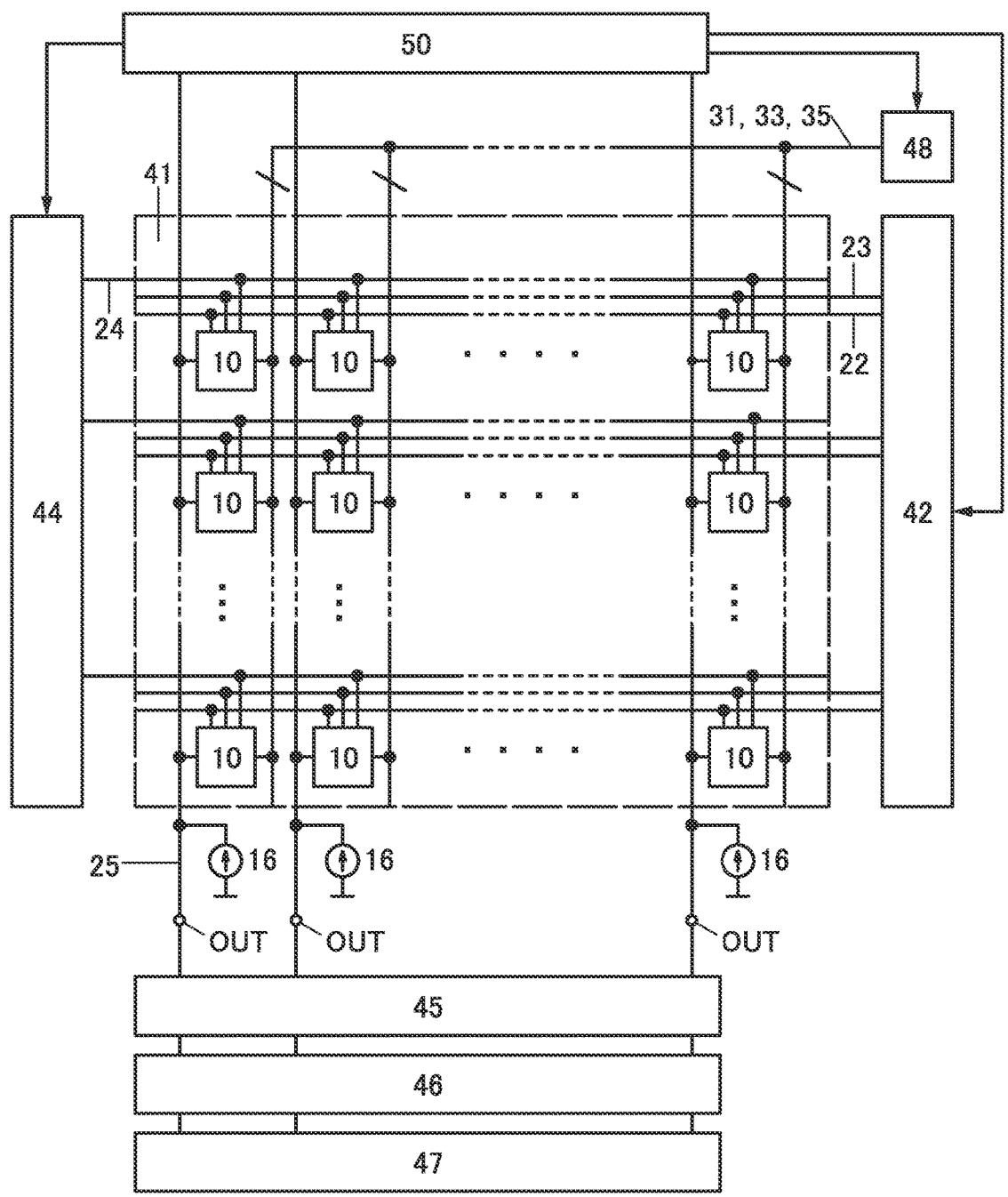
FIG. 6 is a diagram illustrating a configuration example of an imaging device.

FIG. 6 is a block diagram illustrating a configuration example of an imaging device of one embodiment of the present invention that is a modification example of the configuration illustrated in FIG. 3. The configuration of the imaging device illustrated in FIG. 6 differs from the configuration of the imaging device illustrated in FIG. 3 in that a detection circuit 50 is provided.

The detection circuit 50 is electrically connected to the wiring 25. The detection circuit 50 has functions of detecting the potential of the wiring 25 and controlling the operation of the gate driver circuit 42, the signal generation circuit 44, and the power supply circuit 48 in accordance with the detected potential. In the imaging device that includes the detection circuit 50, for example, the level of the potential VRS, the potential Vread, or the potential Vwrite can be adjusted in accordance with the level of the potential of the wiring 25 in read operation. For example, when the pixel 10 has the configuration illustrated in FIG. 1(A) and the potential of the wiring 25 in the read operation is high, the potential VRS can be decreased. Alternatively, the difference between the potential Vread and the potential Vwrite can be decreased. Accordingly, the potential of the node FD can be decreased, and generation of blown-out highlights can be suppressed.

In addition, for example, when the pixel 10 has the configuration illustrated in FIG. 1(A) and the potential of the wiring 25 in the read operation is low, the potential VRS can be increased. Alternatively, the difference between the potential Vread and the potential Vwrite can be increased. Accordingly, the potential of the node FD can be increased, and generation of crushed blacks can be suppressed.

In addition, for example, when the pixel 10 has the configuration illustrated in FIG. 2(A) and the potential of the wiring 25 in the read operation is low, the potential VRS can be increased. Alternatively, the difference between the potential Vwrite and the potential Vread can be decreased. Accordingly, the potential of the node FD can be increased, and generation of blown-out highlights can be suppressed.

In addition, for example, when the pixel 10 has the configuration illustrated in FIG. 2(A) and the potential of the wiring 25 in the read operation is high, the potential VRS can be decreased. Alternatively, the difference between the potential Vwrite and the potential Vread can be increased. Accordingly, the potential of the node FD can be decreased, and generation of crushed blacks can be suppressed.

Then, after the level of the potential VRS, the potential Vread, or the potential Vwrite is adjusted as described above, reset operation, write operation, and read operation can be performed again. Accordingly, in the imaging device of one embodiment of the present invention, generation of crushed whites and blown-out shadows can be suppressed and the dynamic range can be increased.

Note that the detection circuit 50 does not necessarily have a function of controlling the operation of all the gate driver circuit 42, the signal generation circuit 44, and the power supply circuit 48. For example, in the case where the potential VRS is not adjusted in accordance with the potential of the wiring 25, the detection circuit 50 does not necessarily have a function of controlling the power supply circuit 48.

Configuration Example 4 of Imaging Device

Figure 7:
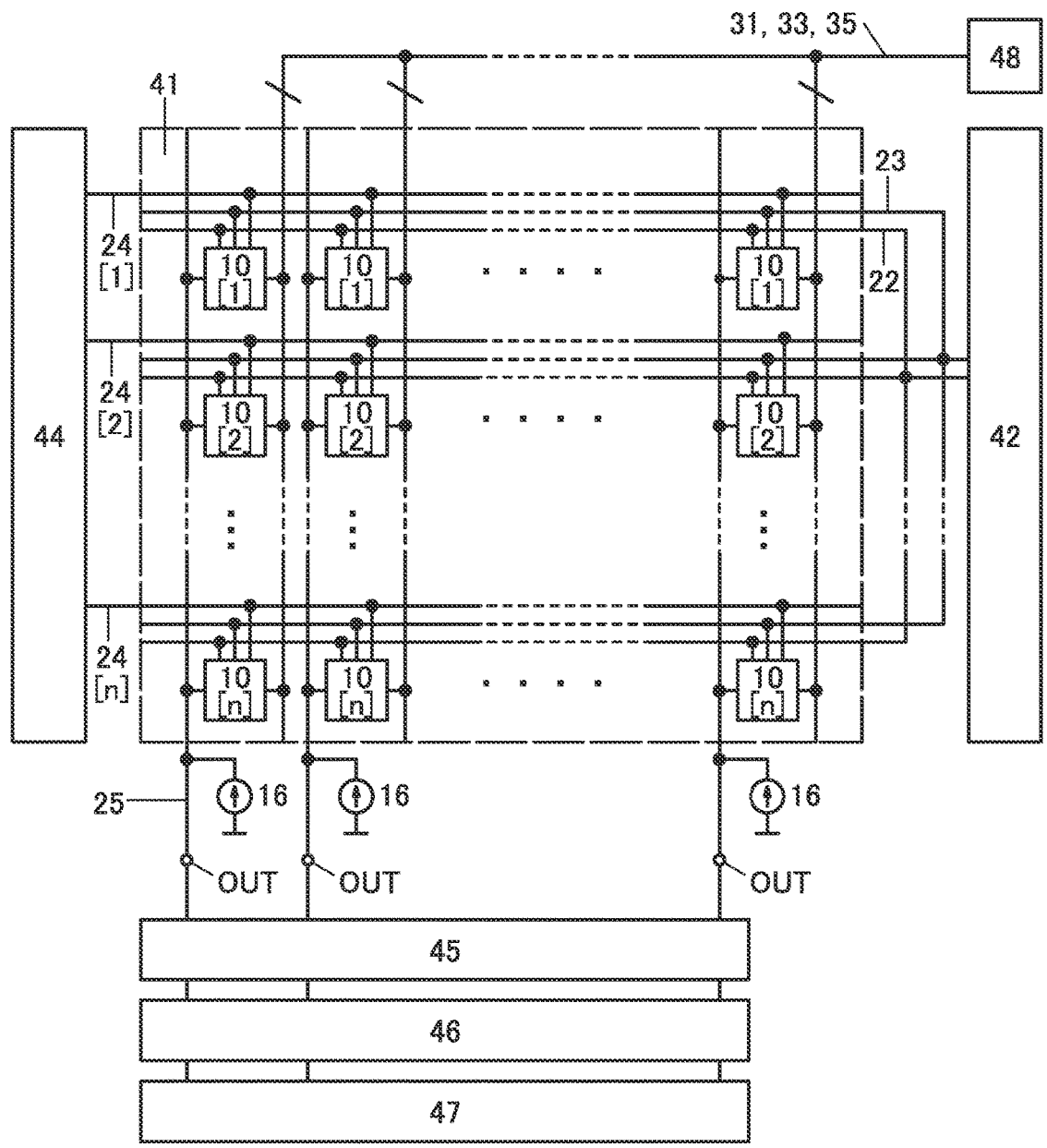
FIG. 7 is a diagram illustrating a configuration example of an imaging device.

FIG. 7 is a block diagram illustrating a configuration example of an imaging device of one embodiment of the present invention that is a modification example of the configuration illustrated in FIG. 3. The configuration of the imaging device illustrated in FIG. 7 differs from the configuration of the imaging device illustrated in FIG. 3 in that all the pixels 10 are electrically connected to the gate driver circuit 42 through one wiring 22 and one wiring 23. In the imaging device with the configuration illustrated in FIG. 7, the pixels 10 are provided in n rows (n is an integer greater than or equal to 2) in the imaging portion 41.

In this specification and the like, for example, the pixel 10 in a first row is referred to as a pixel 10[1], the pixel 10 in a second row is referred to as a pixel 10[2], and the pixel 10 in an n-th row is referred to as a pixel 10[n]. In addition, for example, the wiring 24 electrically connected to the pixel 10[1] is referred to as a wiring 24[1], the wiring 24 electrically connected to the pixel 10[2] is referred to as a wiring 24[2], and the wiring 24 electrically connected to the pixel 10[n] is referred to as a wiring 24[n].

In the imaging device with the configuration illustrated in FIG. 7, imaging data is written to the pixel 10 by a global shutter system. Thus, the simultaneity of imaging can be secured, and an image with less distortion can be easily obtained even when an object moves at high speed. Consequently, the imaging device with the configuration illustrated in FIG. 7 can acquire high-quality imaging data.

Figure 8:
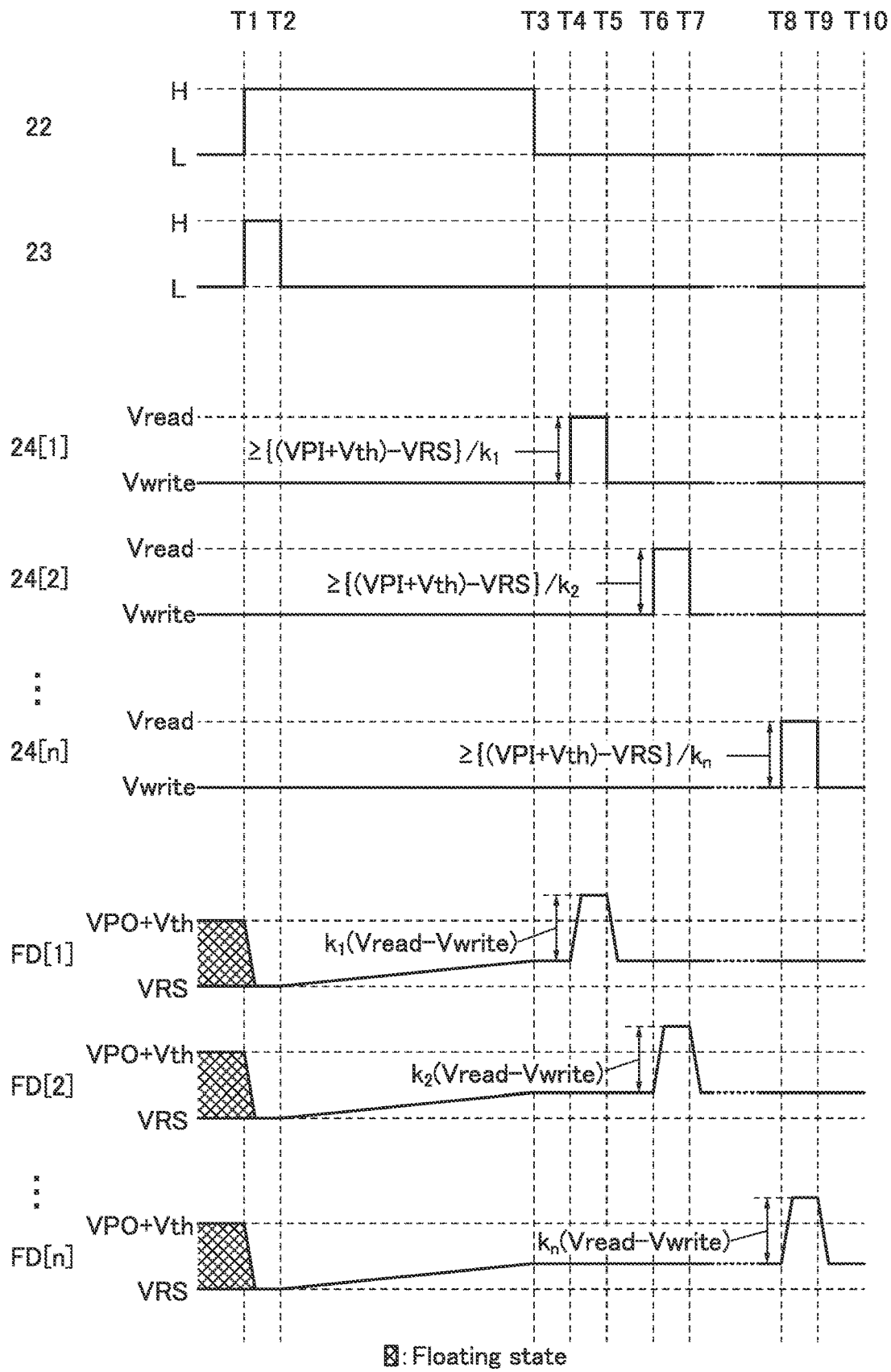
FIG. 8 is a diagram showing an operation example of the imaging device.

FIG. 8 is a timing chart showing an operation example of the pixels 10 in the n rows that are included in the imaging device with the configuration illustrated in FIG. 7. Here, the pixels each have the configuration illustrated in FIG. 1(A). In addition, the potential Vread is set to be higher than the potential Vwrite.

In this specification and the like, for example, the node FD included in the pixel 10[1] is referred to as a node FD[1], the node FD included in the pixel 10[2] is referred to as a node FD[2], and the node FD included in the pixel 10[n] is referred to as a node FD[n]. In addition, for example, a capacitive coupling coefficient k of the node FD[1] is referred to as a capacitive coupling coefficient $k_1$, a capacitive coupling coefficient k of the node FD[2] is referred to as a capacitive coupling coefficient $k_2$, and a capacitive coupling coefficient k of the node FD[n] is referred to as a capacitive coupling coefficient $k_n$.

In a period from Time T1 to Time T2, when the potentials of the wiring 22 and the wiring 23 are set to high potentials, all the transistors 12 and all the transistors 13 are set in on states, and the potentials of the node FD[1] to the node FD[n] are set to the potential VRS that is a reset potential. Thus, electric charge accumulated in all the photoelectric conversion elements 11 and the node FD[1] to the node FD[n] is reset. Note that the potentials of the wiring 24[1] to the wiring 24[n] are set to the potential Vwrite.

Here, the potential VRS can be a potential lower than or equal to the potential "VPI+Vth," and the transistors 15 are n-channel transistors, as described above. Therefore, in the period from Time T1 to Time T2, all the transistors 15 are set in off states.

In a period from Time T2 to Time T3, when the potential of the wiring 22 is set to a high potential and the potential of the wiring 23 is set to a low potential, all the transistors 12 are set in on states and all the transistors 13 are set in off states. This transfers the electric charge accumulated in the photoelectric conversion elements 11 to the node FD in accordance with the illuminance of light delivered to the photoelectric conversion elements 11. Here, for example, the potential VPD that can be set to a high potential is higher than the potential VRS, and thus the potentials of the node FD[1] to the node FD[n] increase in accordance with the illuminance of light delivered to the photoelectric conversion elements 11. Accordingly, imaging data is written to the pixel 10[1] to the pixel 10[n] by a global shutter system. Note that the potentials of the wiring 24[1] to the wiring 24[n] are set to the potential Vwrite.

In a period from Time T3 to Time T4, when the potentials of the wiring 22 and the wiring 23 are set to low potentials, all the transistors 12 and all the transistors 13 are set in off states. Then, write operation is terminated and the potentials of the node FD[1] to the node FD[n] are retained. Thus, the imaging data is retained in the pixel 10[1] to the pixel 10[n]. Here, as described above, the level of the potential VRS is preferably set such that the transistors are set in off states regardless of the illuminance of light delivered to the photoelectric conversion elements 11 in a period from Time T2 to Time T4. Note that the potentials of the wiring 24[1] to the wiring 24[n] are set to the potential Vwrite.

In a period from Time T4 to Time T5, the potentials of the wiring 22 and the wiring 23 are set to low potentials. Thus, all the transistors 12 and all the transistors 13 are set in off states. In addition, the potential of the wiring 24[1] is set to the potential Vread, and the potentials of the wiring 24[2] to the wiring 24[n] are set to the potential Vwrite. Thus, the potential of the node FD[1] is increased by a potential "$k_1$(Vread−Vwrite)" due to capacitive coupling, and the transistor 15 provided in the pixel 10[1] is set in an on state. When the transistor 15 is set in an on state, the potential of the wiring 25 that has a function of a data line is set to a potential corresponding to the potential of the node FD[1]. That is, the imaging data retained in the pixel 10[1] is read.

In a period from Time T5 to Time T6, the potentials of the wiring 22 and the wiring 23 are set to low potentials and the potentials of the wiring 24[1] to the wiring 24[n] are set to the potential Vwrite. Then, all the transistors 12, all the transistors 13, and all the transistors 15 are set in off states and reading of the imaging data retained in the pixel 10[1] is terminated.

In a period from Time T6 to Time T7, the potentials of the wiring 22 and the wiring 23 are set to low potentials. Thus, all the transistors 12 and all the transistors 13 are set in off states. In addition, the potential of the wiring 24[2] is set to the potential Vread, and the potentials of the wiring 24[1] and the wiring 24[3] to the wiring 24[n] are set to the potential Vwrite. Thus, the potential of the node FD[2] is increased by a potential "$k_2$(Vread−Vwrite)" due to capacitive coupling, and the transistor 15 provided in the pixel 10[2] is set in an on state. When the transistor 15 is set in an on state, the potential of the wiring 25 that has a function of a data line is set to a potential corresponding to the potential of the node FD[2]. That is, the imaging data retained in the pixel 10[2] is read.

In a period from Time T7 to Time T8, the potentials of the wiring 22 and the wiring 23 are set to low potentials and the potentials of the wiring 24[1] to the wiring 24[n] are set to the potential Vwrite. Then, all the transistors 12, all the transistors 13, and all the transistors 15 are set in off states and reading of the imaging data retained in the pixel 10[2] is terminated.

In addition, after reading of the imaging data retained in the pixel 10[2] is terminated, the potentials of the wiring 24[3] to the wiring 24[n-1] are sequentially set to the potential Vread, so that the imaging data retained in the pixel 10[3] to the pixel 10[n-1] are sequentially read.

In a period from Time T8 to Time T9, the potentials of the wiring 22 and the wiring 23 are set to low potentials. Thus, all the transistors 12 and all the transistors 13 are set in off states. In addition, the potential of the wiring 24[n] is set to the potential Vread, and the potentials of the wiring 24[1] to the wiring 24[n-1] are set to the potential Vwrite. Thus, the potential of the node FD[n] is increased by a potential "$k_n$(Vread−Vwrite)" due to capacitive coupling, and the transistor 15 provided in the pixel 10[n] is set in an on state. When the transistor 15 is set in an on state, the potential of the wiring 25 that has a function of a data line is set to a potential corresponding to the potential of the node FD[n]. That is, the imaging data retained in the pixel 10[n] is read.

In a period from Time T9 to Time T10, the potentials of the wiring 22 and the wiring 23 are set to low potentials and the potentials of the wiring 24[1] to the wiring 24[n] are set to the potential Vwrite. Then, all the transistors 12, all the transistors 13, and all the transistors 15 are set in off states and reading of the imaging data retained in the pixel 10[n] is terminated.

Consequently, the imaging data retained in all the pixels 10 are read. Here, as shown in FIG. 8, after the write operation is terminated, electric charge needs to be retained in the node FD[n] for a long period, for example. Thus, as described above, a transistor with extremely low off-state current, such as an OS transistor, is preferably used as each of the transistor 12 and the transistor 13.

Pixel Configuration Example 3

FIGS. 9(A), 9(B), 9(C), and 9(D) are diagrams each illustrating a configuration example of the pixel 10 that is a modification example of the configuration illustrated in FIG. 1(A). The configuration of the pixel 10 illustrated in FIG. 9(A) differs from the configuration of the pixel illustrated in FIG. 1(A) in that the one of the source and the drain of the transistor 13 is electrically connected to the one electrode of the photoelectric conversion element 11.

Figure 9A:
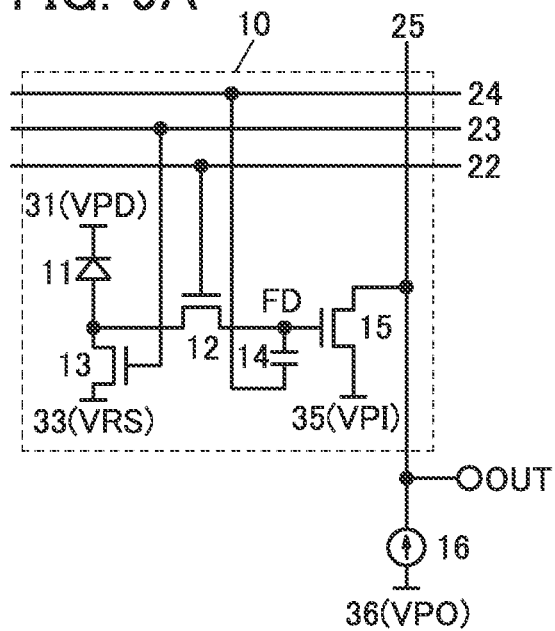
FIG. 9(A) to FIG. 9(D) are diagrams each illustrating a configuration example of the pixel.
Figure 9B:
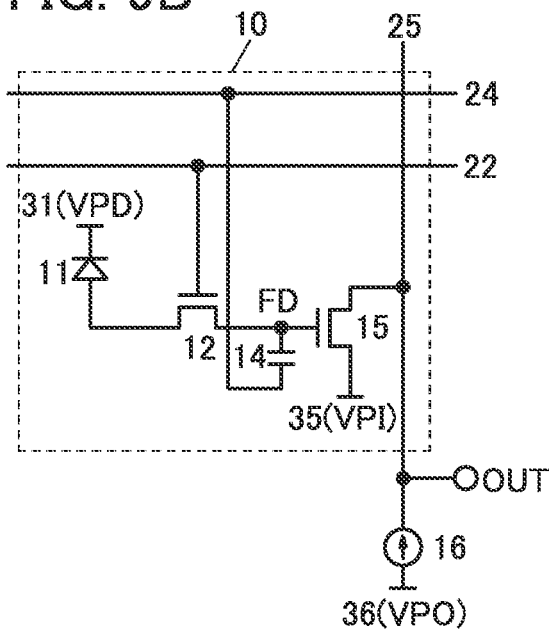

In addition, the configuration of the pixel 10 illustrated in FIG. 9(B) differs from the configuration of the pixel 10 illustrated in FIG. 1(A) in that the transistor 13 is not provided. In the pixel 10 with the configuration of the pixel 10 illustrated in FIG. 9(B), the potential of the node FD can be reset when the transistor 12 is set in an on state and the relationship between the potential VPD and the potential of the node FD is set such that the photoelectric conversion element 11 is forward-biased. For example, like the potential VRS illustrated in FIG. 1(A), when the potential VPD is set to a negative potential, the potential of the node FD can be reset.

Figure 9C:
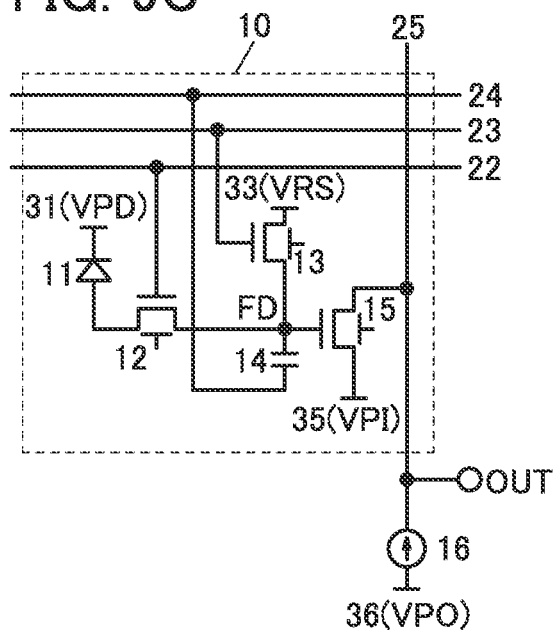
Figure 9D:
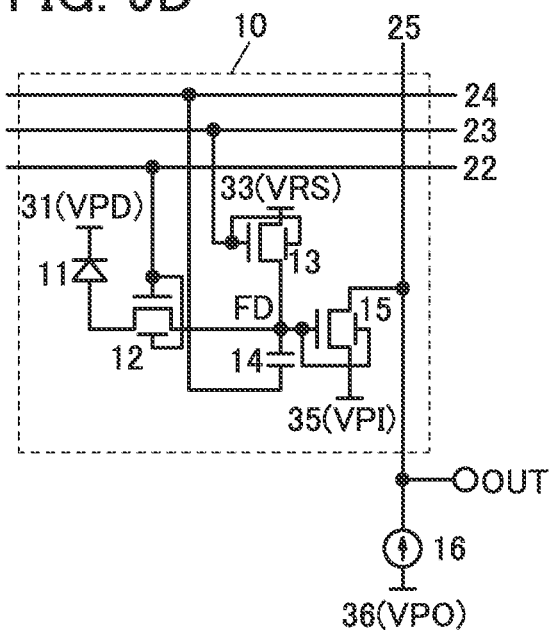

Furthermore, the configuration of the pixel 10 illustrated in each of FIGS. 9(C) and 9(D) differs from the configuration of the pixel 10 illustrated in FIG. 1(A) in that the transistor 12, the transistor 13, and the transistor 15 are provided with back gates. In the pixel 10 with the configuration illustrated in FIG. 9(C), the on-state current of the transistor 12, the transistor 13, and the transistor 15 can be increased when positive potentials are supplied to the back gates of the transistor 12, the transistor 13, and the transistor 15, for example, and the off-state current of the transistor 12, the transistor 13, and the transistor 15 can be decreased when negative potentials are supplied to the back gates of the transistor 12, the transistor 13, and the transistor 15.

In the pixel 10 with the configuration illustrated in FIG. 9(D), the back gates are electrically connected to front gates. This enables the on-state current of the transistors to increase and the off-state current of the transistors to decrease while the potentials of the back gates are easily adjusted.

Note that a configuration where each transistor can perform appropriate operation may be employed, by the combination of FIGS. 9(C) and 9(D), for example. In addition, the pixel may include a transistor that is not provided with a back gate.

This embodiment can be combined with the description of other embodiments as appropriate.

Embodiment 2

In this embodiment, structure examples and the like of the imaging device of one embodiment of the present invention are described.

Figure 10A:
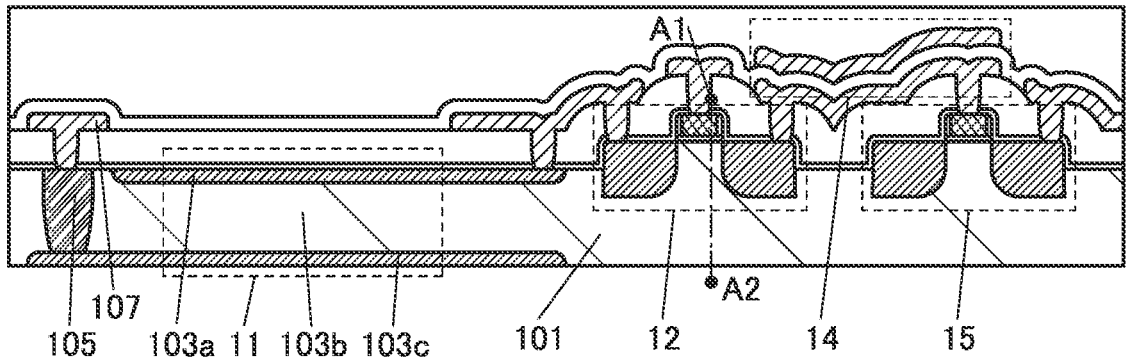
FIG. 10(A) to FIG. 10(C) are diagrams illustrating structure examples of an imaging device.

FIG. 10(A) is a cross-sectional diagram illustrating a structure example of the imaging device of one embodiment of the present invention. FIG. 10(A) illustrates the photoelectric conversion element 11 provided on a substrate 101, the transistor 12 and the transistor 15 whose channel formation regions are provided on the substrate 101, and the capacitor 14 provided over the transistor 12 and the transistor 15.

As the substrate 101, a silicon substrate can be used, for example. Single crystal silicon, amorphous silicon, microcrystalline silicon, polycrystalline silicon, or the like can be used, for example. In the case where a silicon substrate is used as the substrate 101, the transistor 12, the transistor 15, and the like are Si transistors.

In the photoelectric conversion element 11, a layer 103a can be a p$^+$-type region, a layer 103b can be a p-type region, and a layer 103c can be an n$^+$-type region. In addition, the layer 103b is provided with a region 105 that electrically connects the layer 103c to a conductive layer 107 forming the wiring 31. For example, the region 105 can be a p$^+$-type region. Note that imaging measures with the configuration illustrated in FIG. 10(A) can be a front-surface irradiation type imaging device.

Figure 10B:
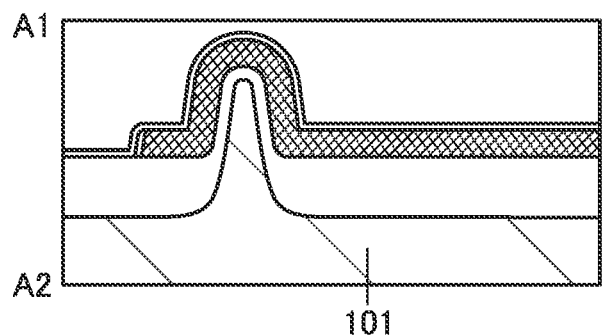

FIG. 10(B) is a cross-sectional view of a cutting plane along dashed-dotted line A1-A2 and is a cross-sectional view of the transistor 12 in a channel width direction. Note that the cross sections of other transistors provided on the substrate 101, such as the transistor 15, in the channel width direction can have structures similar to the structure illustrated in FIG. 10(B).

As illustrated in FIG. 10(B), the channel formation region of the transistor 12 is provided in a protrusion portion of the substrate 101, and a gate electrode is provided to cover the protrusion portion. That is, it can be said that the transistor 12 with the structure illustrated in FIGS. 10(A) and 10(B) is a Fin-type transistor.

Figure 10C:
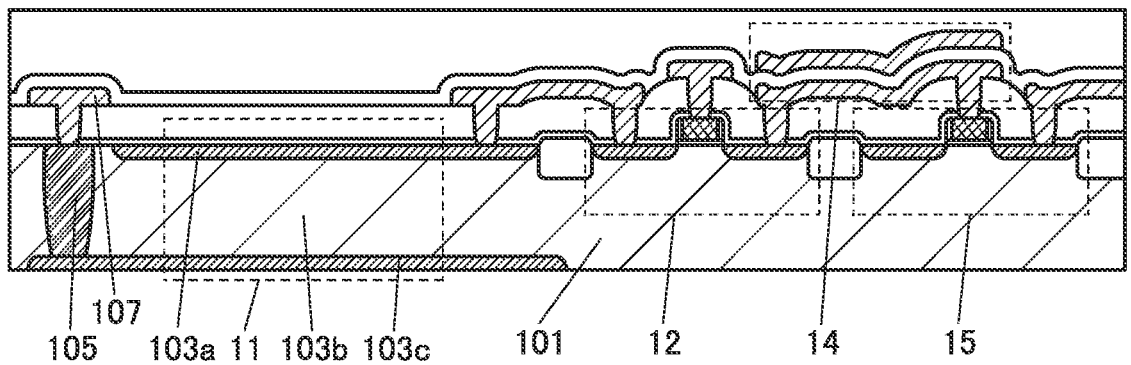

FIG. 10(C) is a cross-sectional diagram illustrating a structure example of the imaging device of one embodiment of the present invention, and the structures of the transistor 12 and the transistor 15 are different from those of the imaging device with the structure illustrated in FIG. 10(A). In FIG. 10(C), the transistor 12 and the transistor 15 are provided on the flat substrate 101. Thus, it can be said that the transistor 12, the transistor 15, and the like with the structures illustrated in FIG. 10(C) are planar-type transistors.

Figure 11A:
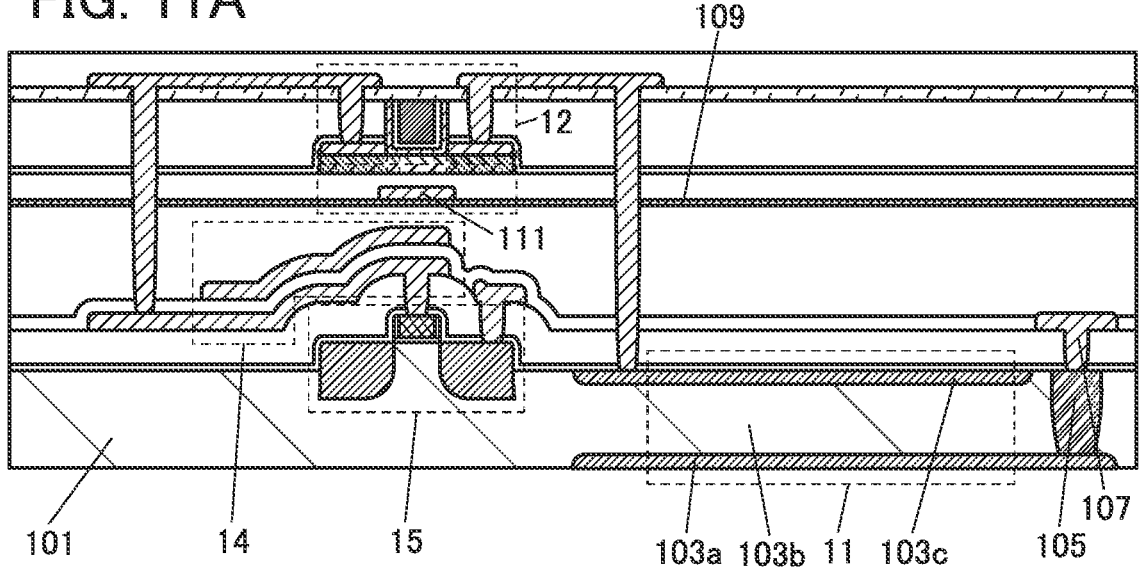
FIG. 11(A) to FIG. 11(E) are diagrams illustrating structure examples of an imaging device.

FIG. 11(A) is a cross-sectional diagram illustrating a structure example of the imaging device of one embodiment of the present invention, and the transistor 12 is provided over the transistor 15 provided on the substrate 101. That is, the transistors included in the imaging device of one embodiment of the present invention are stacked and provided. With such a configuration, the pixel included in the imaging device of one embodiment of the present invention can be miniaturized. Accordingly, the light-receiving area of the photoelectric conversion element 11 can be increased, and the light detection sensitivity of the pixel included in the imaging device of one embodiment of the present invention can be increased. Moreover, the S/N ratio can be increased. Consequently, the imaging device of one embodiment of the present invention can acquire high-quality imaging data. Note that the transistor 13 and the like can have the same structures as the transistor 12.

Here, in the imaging device with the configuration illustrated in FIG. 11(A), the transistor 12 can be an OS transistor. Thus, as described in Embodiment 1, electric charge can be retained in the capacitor 14 for a long period, and imaging data can be written to the pixel included in the imaging device of one embodiment of the present invention by a global shutter system.

Figure 11B:
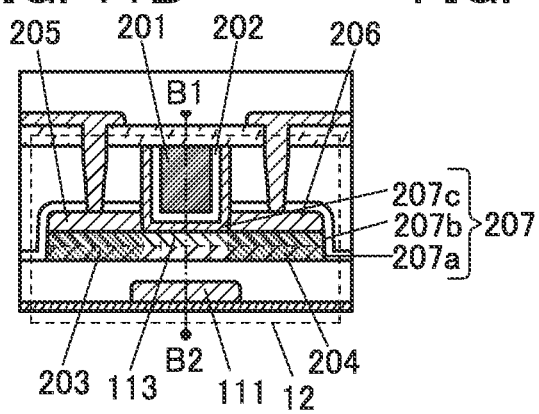

The details of the OS transistor is shown in FIG. 11(B). The OS transistor illustrated in FIG. 11(B) has a self-aligned structure in which an insulating layer is provided over a stacked layer of a metal oxide layer and a conductive layer and a groove reaching the metal oxide layer is provided in insulating layer so that a source electrode 205 and a drain electrode 206 are formed.

The OS transistor can include a channel formation region 113, a source region 203, and a drain region 204 that are formed in a metal oxide layer 207, a gate electrode 201, and a gate insulating film 202. At least the gate insulating film 202 and the gate electrode 201 are provided in the groove. In the OS transistor illustrated in FIG. 11(B), a metal oxide layer 207b is provided over a metal oxide layer 207a, and a metal oxide layer 207c, the source electrode 205, and the drain electrode 206 are provided over the metal oxide layer 207b. Note that in FIG. 11(B) and the like, the metal oxide layer 207a, the metal oxide layer 207b, and the metal oxide layer 207c can be collectively referred to as the metal oxide layer 207, for example.

Figure 11C:
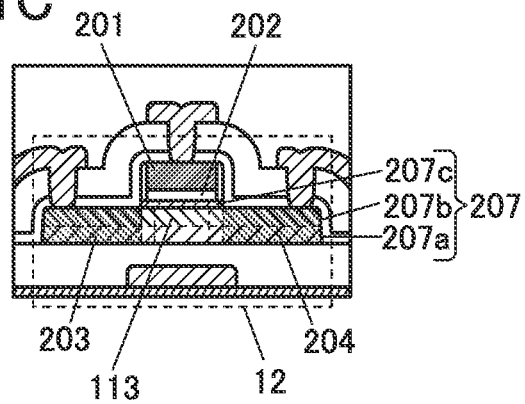

As illustrated in FIG. 11(C), the OS transistor may have a self-aligned structure in which the source region 203 and the drain region 204 are formed in the metal oxide layer 207 with the gate electrode 201 as a mask.

Figure 11D:
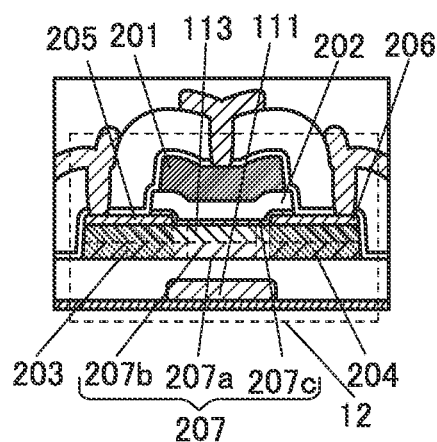

Alternatively, as illustrated in FIG. 11(D), the OS transistor may be a non-self-aligned top-gate transistor including a region where the source electrode 205 or the drain electrode 206 and the gate electrode 201 overlap with each other.

FIGS. 11(A), 11(B), 11(C), and 11(D) illustrate structures where the transistor 12 includes a back gate electrode 111. The on-state current of the transistor 12 can be increased when a positive potential is supplied to the back gate electrode 111, for example, and the off-state current of the transistor 12 can be decreased when a negative potential is supplied to the back gate electrode 111.

Figure 11E:
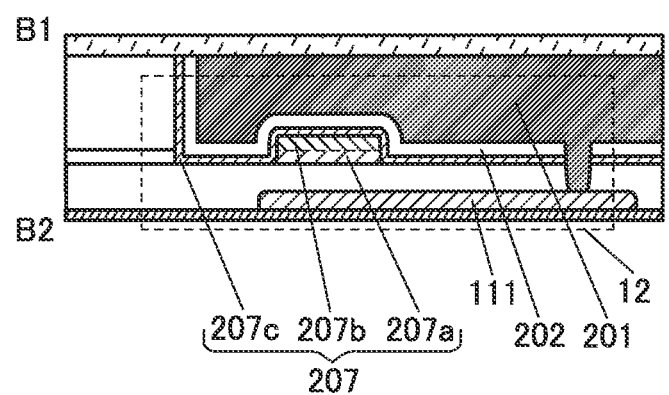

FIG. 11(E) is a cross-sectional view of a cutting plane along dashed-dotted line B1-B2 illustrated in FIG. 11(B) and is a cross-sectional view of the transistor 12 in the channel width direction. As illustrated in FIG. 11(E), the back gate electrode 111 may be electrically connected to the gate electrode 201 that is provided to face each other with the gate insulating film 202 and the like therebetween. This enables the on-state current of the transistor 12 to increase and the off-state current of the transistor 12 to decrease while the potential of the back gate electrode 111 is easily adjusted. Note that the transistor 12 does not necessarily include the back gate electrode 111.

An insulating layer 109 that has a function of preventing diffusion of hydrogen is provided between a region where an OS transistor is formed and a region where a Si transistor is formed. That is, the insulating layer 109 can be provided between the transistor 15 and the transistor 12, for example. Hydrogen in the insulating layer provided in the vicinity of the channel formation region of the Si transistor terminates a dangling bond of silicon. Meanwhile, hydrogen in the insulating layer provided in the vicinity of the channel formation region of the OS transistor is a factor in generating a carrier in the metal oxide layer.

The reliability of the Si transistor can be improved when the insulating layer 109 enables trapping of hydrogen in a layer where the Si transistor is provided. In addition, the reliability of the OS transistor can be improved when diffusion of hydrogen from the layer where the Si transistor is provided to a layer where the OS transistor is provided is inhibited.

For the insulating layer 109, for example, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used.

Figure 12A:
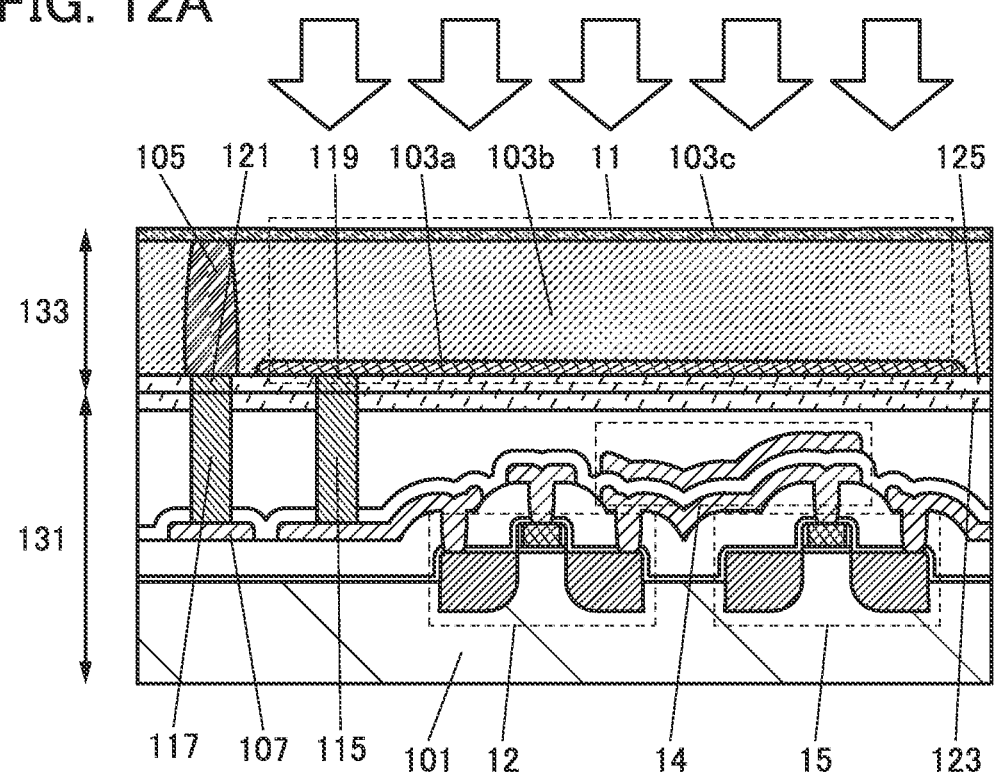
FIG. 12(A) and FIG. 12(B) are diagrams each illustrating a structure example of an imaging device

FIG. 12(A) is a cross-sectional view illustrating a structure example of the imaging device of one embodiment of the present invention that is a modification example of the configuration illustrated in FIG. 10(A). The configuration of the imaging device illustrated in FIG. 12(A) differs from the configuration illustrated in FIG. 10(A) in that the photoelectric conversion element 11 is provided to include a region overlapping with the transistor 12, the capacitor 14, the transistor 15, and the like. Here, a layer where the transistor 12, the capacitor 14, the transistor 15, and the like are provided is referred to as a layer 131, and a layer where the photoelectric conversion element 11 is provided is referred to as a layer 133.

Here, FIG. 12(A) illustrates a structure example in which electrical connection between components included in the layer 131 and components included in the layer 133 is obtained by a bonding technique.

An insulating layer 123 is provided in the layer 131, and a conductive layer 115 and a conductive layer 117 are provided to each include a region embedded in the insulating layer 123. The conductive layer 115 is electrically connected to the one of the source and the drain of the transistor 12. The conductive layer 117 is electrically connected to the conductive layer 107. Furthermore, the insulating layer 123, the conductive layer 115, and the conductive layer 117 are planarized to be level with each other.

An insulating layer 125 is provided in the layer 133, and a conductive layer 119 and a conductive layer 121 are provided to each include a region embedded in the insulating layer 125. The insulating layer 125 includes a region that is in contact with the insulating layer 123, the conductive layer 115 includes a region that is in contact with the conductive layer 119, and the conductive layer 117 includes a region that is in contact with the conductive layer 121. Accordingly, the one of the source and the drain of the transistor 12 is electrically connected to the layer 103*a* through the conductive layer 115 and the conductive layer 119, and the conductive layer 107 is electrically connected to the layer 103*c* through the conductive layer 117, the conductive layer 121, and the region 105. Furthermore, the insulating layer 125, the conductive layer 119, and the conductive layer 121 are planarized to be level with each other.

Here, main components of the conductive layer 115 and the conductive layer 119 are preferably the same metal element. In addition, main components of the conductive layer 117 and the conductive layer 121 are preferably the same metal element. Furthermore, the insulating layer 123 and the insulating layer 125 are preferably formed of the same component.

For example, for the conductive layer 115, the conductive layer 117, the conductive layer 119, and the conductive layer 121, Cu, Al, Sn, Zn, W, Ag, Pt, Au, or the like can be used. Preferably, Cu, Al, W, or Au is used for easy bonding. In addition, for the insulating layer 123 and the insulating layer 125, silicon oxide, silicon oxynitride, silicon nitride oxide, silicon nitride, titanium nitride, or the like can be used.

That is, the same metal element described above is preferably used for a combination of the conductive layer 115 and the conductive layer 119, and the same metal element described above is preferably used for a combination of the conductive layer 117 and the conductive layer 121. Furthermore, the same insulating material described above is preferably used for the insulating layer 123 and the insulating layer 125. With this structure, bonding where a boundary between the layer 131 and the layer 133 is a bonding position can be performed.

This bonding enables electrical connection between the conductive layer 115 and the conductive layer 119 and between the conductive layer 117 and the conductive layer 121. In addition, connection between the insulating layer 123 and the insulating layer 125 with mechanical strength can be obtained.

For bonding metal layers to each other, a surface activated bonding method in which an oxide film, a layer adsorbing impurities, and the like on the surface are removed by sputtering processing or the like and the cleaned and activated surfaces are brought into contact to be bonded to each other can be used. Alternatively, a diffusion bonding method in which surfaces are bonded to each other by using temperature and pressure together, or the like can be used. Both methods can cause bonding at an atomic level and therefore the bonding with excellent electric and mechanical strength can be achieved.

Furthermore, for bonding insulating layers to each other, a hydrophilic bonding method or the like can be used; in the method, after high planarity is obtained by polishing or the like, surfaces of the insulating layers subject to hydrophilic treatment with oxygen plasma or the like are arranged in contact with and bonded to each other temporarily, and then dehydrated by heat treatment to perform final bonding. The hydrophilic bonding can also cause bonding at an atomic level; thus, bonding with excellent mechanical strength can be achieved.

When the layer 131 and the layer 133 are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to anti-oxidation treatment and then hydrophilic treatment, and bonding is performed. Furthermore, hydrophilic treatment may be performed on the surfaces of the metal layers being hardly oxidizable metal such as Au. Note that a bonding method other than the above method may be used.

In the imaging device with the configuration illustrated in FIG. 12(A), light can be delivered from the directions of arrows. That is, the imaging device with the configuration illustrated in FIG. 12(A) can be a back-surface irradiation type imaging device. Thus, light that enters the imaging device can be inhibited from being blocked by a wiring or the like provided in the imaging device. Accordingly, the light-receiving area of the photoelectric conversion element 11 can be increased, and the light detection sensitivity of the pixel included in the imaging device of one embodiment of the present invention can be increased. Moreover, the S/N ratio can be increased. Consequently, the imaging device of one embodiment of the present invention can acquire high-quality imaging data.

Figure 12B:
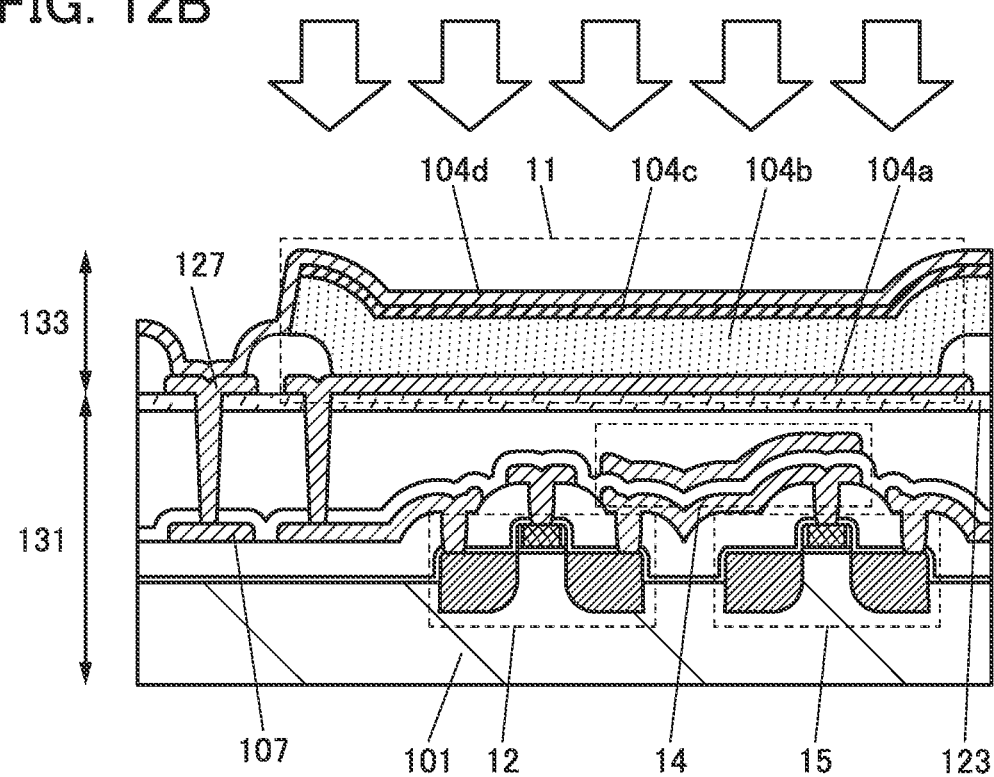

FIG. 12(B) is a cross-sectional view illustrating a structure example of the imaging device of one embodiment of the present invention that is a modification example of the configuration illustrated in FIG. 12(A). The configuration of the imaging device illustrated in FIG. 12(B) differs from the configuration of the imaging device illustrated in FIG. 12(A) in that the photoelectric conversion element 11 has a stack structure of a layer 104*a*, a layer 104*b*, a layer 104*c*, and a layer 104*d*. The layer 104*a* and the layer 104*d* each have a function of an electrode, and the layer 104*b* and the layer 104*c* have a function of a photoelectric conversion portion.

In the imaging device with the configuration illustrated in FIG. 12(B), the layer 133 can be formed directly on the layer 131. The layer 104*a* is electrically connected to the one of the source and the drain of the transistor 12. The layer 104*d* is electrically connected to the conductive layer 107 through the conductive layer 127.

The layer 104*a* is preferably a low-resistance metal layer or the like. For example, aluminum, titanium, tungsten, tantalum, silver, or a stacked layer thereof can be used.

A conductive layer having a high light-transmitting property with respect to visible light is preferably used for the layer 104*d*. For example, indium oxide, tin oxide, zinc oxide, indium tin oxide, gallium zinc oxide, indium gallium zinc oxide, graphene, or the like can be used. Note that a structure in which the layer 104*d* is omitted can also be employed.

A structure of a pn-junction photodiode containing a selenium-based material in a photoelectric conversion layer can be used for the layer 104*b* and the layer 104*c* of the photoelectric conversion portion, for example. In the case where this structure is employed, a selenium-based material, which is a p-type semiconductor, is preferably used for the layer 104*b*, and gallium oxide or the like, which is an n-type semiconductor, is preferably used for the layer 104*c*.

A photoelectric conversion element using a selenium-based material has characteristics of high external quantum efficiency with respect to visible light. In the photoelectric conversion element, the amount of amplification of electrons with respect to the amount of incident light can be increased by utilizing avalanche multiplication. A selenium-based material has a high light-absorption coefficient and thus has advantages in production; for example, a photoelectric conversion layer can be manufactured using a thin film. A thin film of a selenium-based material can be formed by a vacuum evaporation method, a sputtering method, or the like.

For the selenium-based material, crystalline selenium such as single crystal selenium and polycrystalline selenium can be used, for example. Alternatively, amorphous selenium can be used. Alternatively, a compound of copper, indium, and selenium (CIS) can be used. Alternatively, a compound of copper, indium, gallium, and selenium (CIGS) can be used.

An n-type semiconductor is preferably formed using a material having a wide band gap and a light-transmitting property with respect to visible light. For example, zinc oxide, gallium oxide, indium oxide, tin oxide, a mixed oxide thereof, or the like can be used. In addition, these materials also have a function of a hole injection blocking layer, and dark current can be decreased.

Note that the photoelectric conversion element 11 may include an organic photoconductive film. In that case, the layer 104b can have a structure where a hole-transport layer, a photoelectric conversion layer, and an electron-transport layer are stacked and provided. Here, for the hole-transport layer, for example, molybdenum oxide or the like can be used. In addition, for the electron-transport layer, for example, fullerene such as $C_{60}$ or $C_{70}$, a derivative thereof, or the like can be used. Furthermore, for the photoelectric conversion layer, a mixed layer (a bulk heterojunction structure) of an n-type organic semiconductor and a p-type organic semiconductor can be used.

Figure 13A:
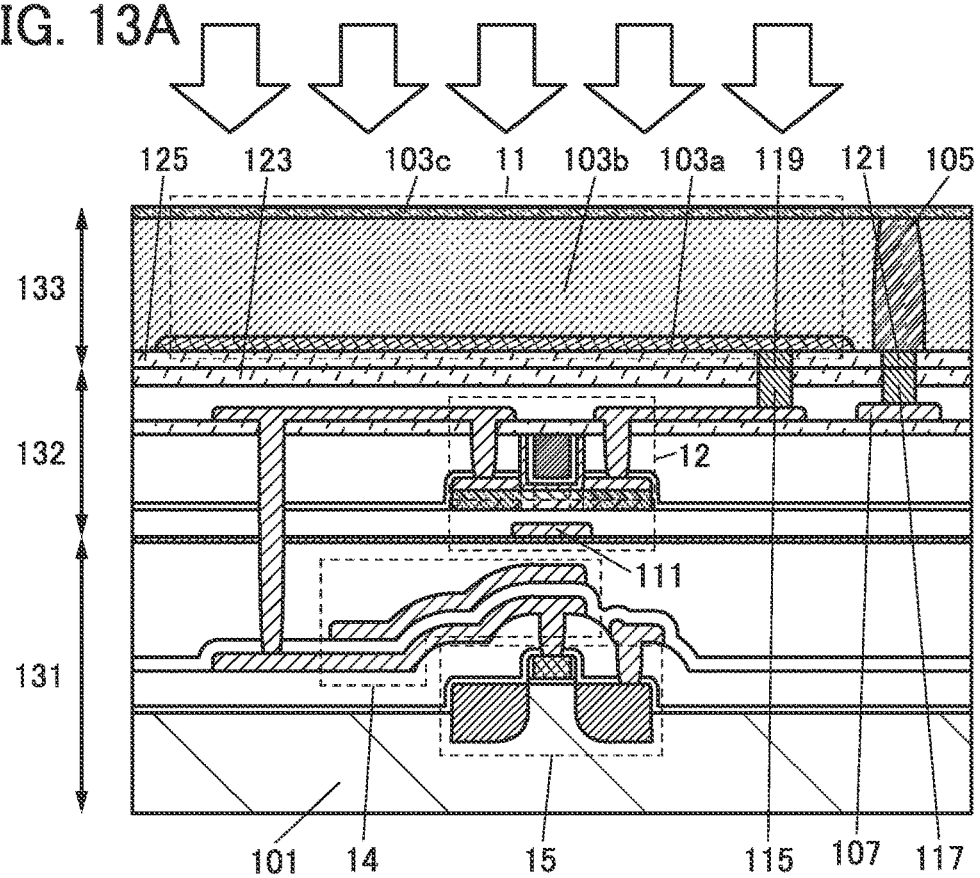
FIG. 13(A) and FIG. 13(B) are diagrams each illustrating a structure example of an imaging device.

FIG. 13(A) is a cross-sectional view illustrating a structure example of the imaging device of one embodiment of the present invention that is a modification example of the configuration illustrated in FIG. 11(A). The configuration of the imaging device illustrated in FIG. 13(A) differs from the configuration illustrated in FIG. 11(A) in that the photoelectric conversion element 11 is provided to include a region overlapping with the transistor 12, the capacitor 14, the transistor 15, and the like. That is, the configuration of the imaging device illustrated in FIG. 13(A) differs from the configuration illustrated in FIG. 11(A) in that the capacitor 14, the transistor 15, and the like, the transistor 12 and the like, and the photoelectric conversion element 11 are stacked and provided. Here, a layer where the capacitor 14, the transistor 15, and the like are provided is referred to as the layer 131, a layer where the transistor 12 and the like are provided is referred to as a layer 132, and a layer where the photoelectric conversion element 11 is provided is referred to as the layer 133.

Here, FIG. 13(A) illustrates a structure example in which electrical connection between components included in the layer 132 and components included in the layer 133 is obtained by a bonding technique. In addition, as in the imaging device with the configuration illustrated in FIG. 12(A), in the imaging device with the configuration illustrated in FIG. 13(A), light can be delivered from the directions of arrows. That is, the imaging device with the configuration illustrated in FIG. 13(A) can be a back-surface irradiation type imaging device.

Figure 13B:
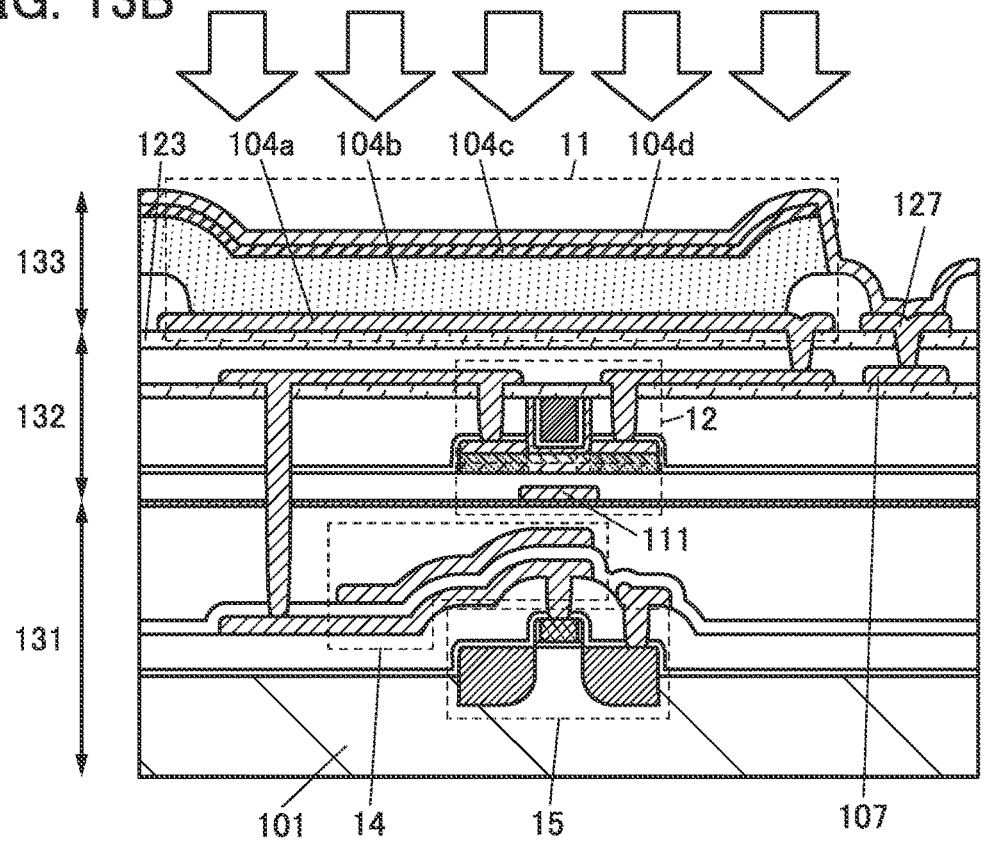

FIG. 13(B) is a cross-sectional view illustrating a structure example of the imaging device of one embodiment of the present invention that is a modification example of the configuration illustrated in FIG. 13(A). Like FIG. 12(B), the configuration of the imaging device illustrated in FIG. 13(B) differs from the configuration of the imaging device illustrated in FIG. 13(A) in that the photoelectric conversion element 11 has a stack structure of the layer 104a, the layer 104b, the layer 104c, and the layer 104d.

In the imaging device with the configuration illustrated in FIG. 13(B), the layer 133 can be formed directly on the layer 132. In addition, as in the imaging device with the configuration illustrated in FIG. 12(B), the layer 104a is electrically connected to the one of the source and the drain of the transistor 12, and the layer 104d is electrically connected to the conductive layer 107 through the conductive layer 127.

Figure 14A:
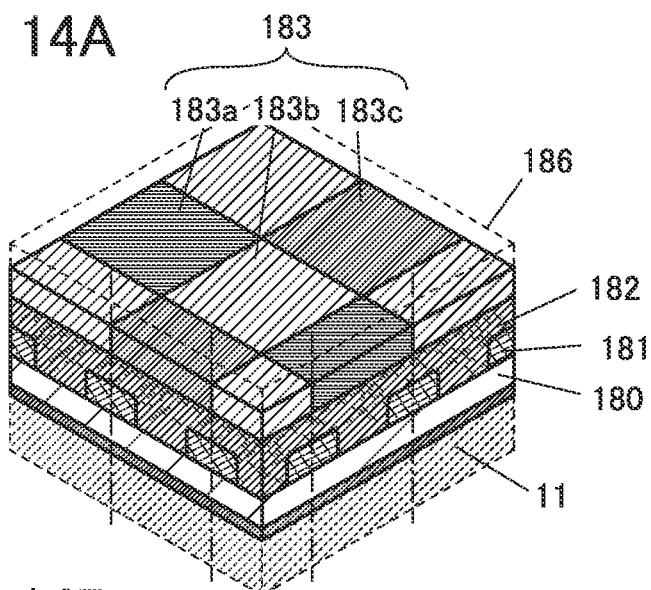
FIG. 14(A) to FIG. 14(C) are diagrams each illustrating a structure example of an imaging device.

FIG. 14(A) is a perspective view illustrating an example in which a color filter and the like are added to the pixel of the imaging device of one embodiment of the present invention. In the perspective view, cross sections of a plurality of pixels are also shown. An insulating layer 180 is formed over the photoelectric conversion element 11. For the insulating layer 180, a silicon oxide film with a high light-transmitting property with respect to visible light can be used, for example. In addition, a silicon nitride film may be stacked as a passivation film. Furthermore, a dielectric film of hafnium oxide or the like may be stacked as an anti-reflection film.

A light-blocking layer 181 may be formed over the insulating layer 180. The light-blocking layer 181 has a function of preventing color mixing of light passing through the upper color filter. As the light-blocking layer 181, a metal layer of aluminum, tungsten, or the like can be used. Alternatively, the metal layer and a dielectric film having a function of an anti-reflection film may be stacked.

An organic resin layer 182 can be provided as a planarization film over the insulating layer 180 and the light-blocking layer 181. In addition, a color filter 183 (a color filter 183a, a color filter 183b, and a color filter 183c) is formed in each pixel. Color images can be obtained, for example, when colors of R (red), G (green), B (blue), Y (yellow), C (cyan), M (magenta), and the like are assigned to the color filter 183a, the color filter 183b, and the color filter 183c.

An insulating layer 186 having a light-transmitting property with respect to visible light can be provided over the color filter 183, for example.

Figure 14B:
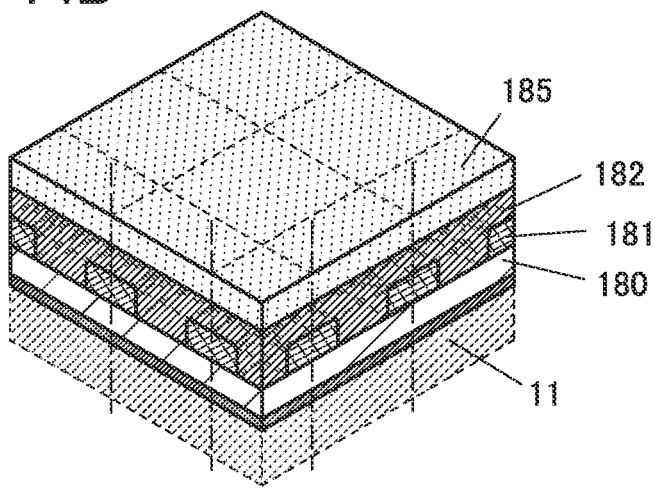

Alternatively, as shown in FIG. 14(B), a photoelectric conversion layer 185 may be used instead of the color filter 183. Such a structure enables the imaging device capable of obtaining images in various wavelength regions.

For example, when a filter that blocks light having a wavelength shorter than or equal to that of visible light is used as the photoelectric conversion layer 185, an infrared imaging device can be obtained. Alternatively, when a filter that blocks light having a wavelength shorter than or equal to that of near infrared light is used as the photoelectric conversion layer 185, a far-infrared imaging device can be obtained. Alternatively, when a filter that blocks light having a wavelength longer than or equal to that of visible light is used as the photoelectric conversion layer 185, an ultraviolet imaging device can be obtained.

Furthermore, when a scintillator is used as the photoelectric conversion layer 185, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the light is sensed by the photoelectric conversion element 11, so that image data is obtained. Furthermore, the imaging device having this structure may be used in a radiation detector or the like.

The scintillator contains a substance that, when irradiated with radiation such as X-rays or gamma-rays, absorbs energy of the radiation to emit visible light or ultraviolet light. For example, resin or ceramics in which $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, ZnO, or the like is dispersed can be used.

Note that in the photoelectric conversion element 11 using a selenium-based material, radiation such as X-rays can be directly converted into electric charge; thus, a structure that does not require a scintillator can be employed.

Figure 14C:
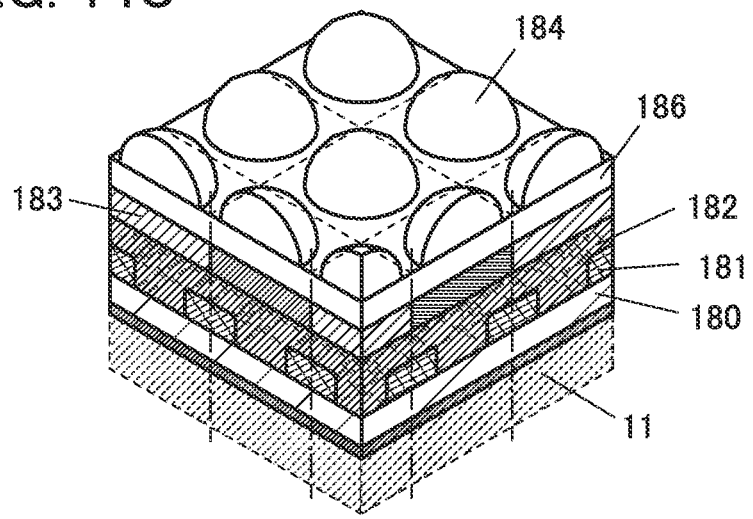

In addition, as shown in FIG. 14(C), a microlens array 184 may be provided over the color filter 183. Light passing through an individual lens of the microlens array 184 goes through the color filter 183 directly under the lens, and the photoelectric conversion element 11 is irradiated with the light. Furthermore, the microlens array 184 may be provided over the photoelectric conversion layer 185 shown in FIG. 14(B).

Examples of a package and a camera module in each of which an image sensor chip is placed will be described below. For the image sensor chip, the structure of the above imaging device can be used.

FIG. 15(A1) is an external perspective view of the top surface side of a package in which an image sensor chip is placed. The package includes a package substrate 410 to which the image sensor chip is fixed, a cover glass 420, an adhesive 430 for bonding the package substrate 410 and the cover glass 420, and the like.

FIG. 15(A2) is an external perspective view of the bottom surface side of the package. A BGA (Ball grid array) in which solder balls serve as bumps 440 is provided on the bottom surface of the package. Note that, without being limited to the BGA, an LGA (Land grid array), a PGA (Pin Grid Array), or the like may be included.

FIG. 15(A3) is a perspective view of the package, in which part of the cover glass 420 and part of the adhesive 430 are not illustrated. Electrode pads 460 are formed over the package substrate 410, and the electrode pads 460 and the bumps 440 are electrically connected via through-holes 442. The electrode pads 460 are electrically connected to an image sensor chip 450 through wires 470.

In addition, FIG. 15(B1) is an external perspective view of the top surface side of a camera module in which an image sensor chip is placed in a package with a built-in lens. The camera module includes a package substrate 411 to which an image sensor chip is fixed, a lens cover 421, a lens 435, and the like.

FIG. 15(B2) is an external perspective view of the bottom surface side of the camera module. The bottom surface and side surfaces of the package has a QFN (Quad flat no-lead package) structure in which lands 441 for installation are provided. Note that this structure is an example, and a QFP (Quad flat package) or the BGA may be provided.

FIG. 15(B3) is a perspective view of the module, in which parts of the lens cover 421 and the lens 435 are not illustrated. An IC chip 490 having functions of a driver circuit, a signal conversion circuit, and the like of an imaging device is also provided between the package substrate 411 and an image sensor chip 451; thus, a structure as an SiP (System in package) is included. The lands 441 are electrically connected to electrode pads 461, which is not illustrated in FIG. 15(B3). In addition, the electrode pads 461 are electrically connected to the image sensor chip 451 or the IC chip 490 through wires 471.

The image sensor chip placed in a package having the above form can be easily mounted on a printed substrate or the like, and the image sensor chip can be incorporated into a variety of semiconductor devices and electronic devices.

This embodiment can be combined with the description of other embodiments as appropriate.

Embodiment 3

In this embodiment, the composition of a CAC (Cloud-Aligned Composite)-OS that can be used in a transistor disclosed in one embodiment of the present invention is described.

The CAC-OS is, for example, a composition of a material in which elements that constitute a metal oxide are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in a metal oxide is referred to as a mosaic pattern or a patch-like pattern.

Note that the metal oxide preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as $InO_{X1}$ (X1 is a real number greater than 0)) or indium zinc oxide (hereinafter referred to as $In_{X2}Zn_{Y2}O_{Z2}$ (each of X2, Y2, and Z2 is a real number greater than 0)) and gallium oxide (hereinafter referred to as $GaO_{X3}$ (X3 is a real number greater than 0)), gallium zinc oxide (hereinafter referred to as $Ga_{X4}Zn_{Y4}O_{Z4}$ (each of X4, Y4, and Z4 is a real number greater than 0)), or the like so that a mosaic pattern is formed, and mosaic-like $InO_{X1}$ or $In_{X2}Zn_{Y2}O_{Z2}$ is evenly distributed in the film (this composition is hereinafter also referred to as a cloud-like composition).

That is, the CAC-OS is a composite metal oxide having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \le x0 \le 1$; m0 is a given number).

The crystalline compound has a single crystal structure, a polycrystalline structure, or a CAAC (C-Axis Aligned Crystal) structure. Note that the CAAC structure is a crystal structure in which a plurality of IGZO nanocrystals have c-axis alignment and are connected in an a-b plane without alignment.

Meanwhile, the CAC-OS relates to the material composition of a metal oxide. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary between the region where $GaO_{X3}$ is a main component and the region where $In_{X2}Zn_{Y2}O_{Z2}$ or $InO_{X1}$ is a main component cannot be observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated intentionally, for example. In addition, in the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from X-ray diffraction measurement that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region (a ring region) and a plurality of bright spots in the ring region are observed. It is therefore found from the electron diffraction pattern that the crystal structure of the CAC-OS includes an nc (nano-crystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions including the respective elements as the main components form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{X2}Zn_{Y2}O_{Z2}$ or $InO_{X1}$ is a main component, the conductivity of a metal oxide is exhibited. Accordingly, when the regions where $In_{X2}Zn_{Y2}O_{Z2}$ or $InO_{X1}$ is a main component are distributed like a cloud in a metal oxide, high field-effect mobility (μ) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in a metal oxide, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, so that high on-state current ($I_{on}$) and high field-effect mobility (μ) can be achieved.

In addition, a semiconductor element using the CAC-OS has high reliability. Thus, the CAC-OS is suitable for a variety of semiconductor devices typified by a display.

This embodiment can be combined with the description of other embodiments as appropriate.

Embodiment 4

In this embodiment, electronic devices in which the imaging device of one embodiment of the present invention can be used will be described.

Examples of an electronic device that can include an imaging device of one embodiment of the present invention include display devices, personal computers, image memory devices or image reproducing devices provided with storage media, cellular phones, game consoles including portable game consoles, portable data terminals, e-book readers, cameras such as video cameras and digital still cameras, goggle-type displays (head-mounted displays), navigation systems, audio reproducing devices (car audio players, digital audio players, and the like), copiers, facsimiles, printers, multifunction printers, automated teller machines (ATM), vending machines, and the like. FIGS. 16(A) to 16(F) illustrate specific examples of these electronic devices.

Figure 16A:
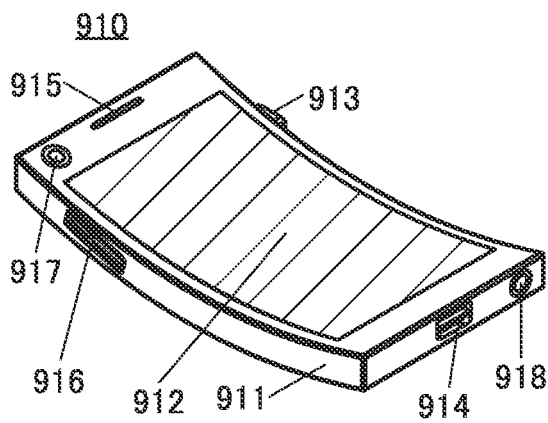
FIG. 16(A) to FIG. 16(F) are diagrams illustrating examples of electronic devices.

FIG. 16(A) is an example of a cellular phone 910, which includes a housing 911, a display portion 912, an operation button 913, an external connection port 914, a speaker 915, a connector 916, a camera 917, an earphone jack 918, and the like. In the cellular phone 910, the display portion 912 can be provided with a touch sensor. All operations including making a call and inputting text can be performed by touching the display portion 912 with a finger, a stylus, or the like. In addition, a variety of removable memory devices such as a memory card, for example, an SD card, a USB memory, and an SSD (Solid State Drive), can be inserted in the connector 916.

The imaging device of one embodiment of the present invention and an operation method thereof can be applied to components for acquiring imaging data in the cellular phone 910. Consequently, the cellular phone 910 can acquire high-quality imaging data.

Figure 16B:
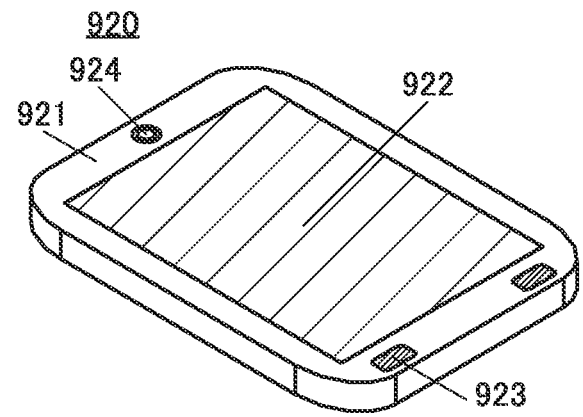

FIG. 16(B) is an example of a portable data terminal 920, which includes a housing 921, a display portion 922, speakers 923, a camera 924, and the like. A touch panel function of the display portion 922 enables input and output of information. Furthermore, a character or the like in an image that is captured by the camera 924 can be recognized and the character can be voice-output from the speaker 923.

The imaging device of one embodiment of the present invention and an operation method thereof can be applied to components for acquiring imaging data in the portable data terminal 920. Consequently, the portable data terminal 920 can acquire high-quality imaging data.

Figure 16C:
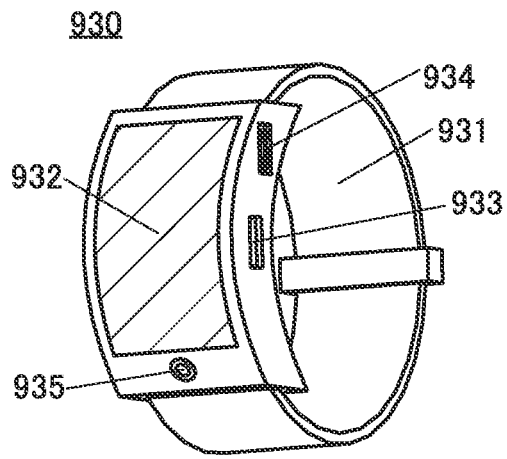

FIG. 16(C) is an example of a wristwatch-type information terminal 930, which includes a housing/wristband 931, a display portion 932, an operation button 933, an external connection port 934, a camera 935, and the like. The display portion 932 is provided with a touch panel for operating the information terminal 930. The housing/wristband 931 and the display portion 932 have flexibility and fit a body well.

The imaging device of one embodiment of the present invention and an operation method thereof can be applied to components for acquiring imaging data in the information terminal 930. Consequently, the information terminal 930 can acquire high-quality imaging data.

Figure 16D:
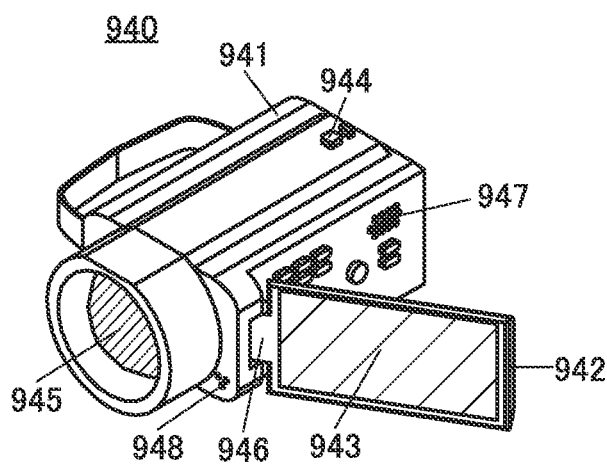

FIG. 16(D) is an example of a video camera 940, which includes a first housing 941, a second housing 942, a display portion 943, operation keys 944, a lens 945, a hinge 946, a speaker 947, a microphone 948, and the like. The operation keys 944 and the lens 945 can be provided in the first housing 941, and the display portion 943 can be provided in the second housing 942.

The imaging device of one embodiment of the present invention and an operation method thereof can be applied to components for acquiring imaging data in the video camera 940. Consequently, the video camera 940 can acquire high-quality imaging data.

Figure 16E:
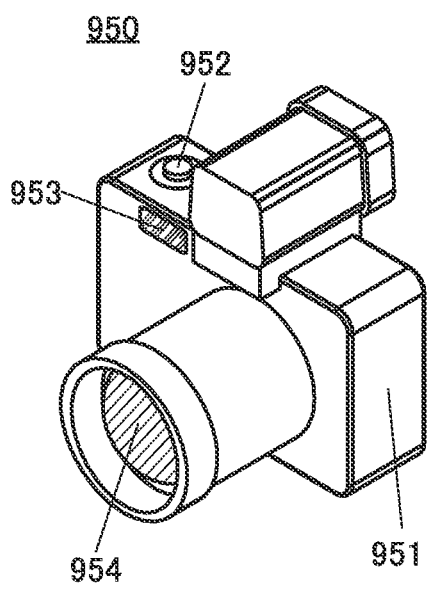

FIG. 16(E) is an example of a digital camera 950, which includes a housing 951, a shutter button 952, a light-emitting portion 953, a lens 954, and the like. The imaging device of one embodiment of the present invention and an operation method thereof can be applied to components for acquiring imaging data in the digital camera 950. Consequently, the digital camera 950 can acquire high-quality imaging data.

Figure 16F:
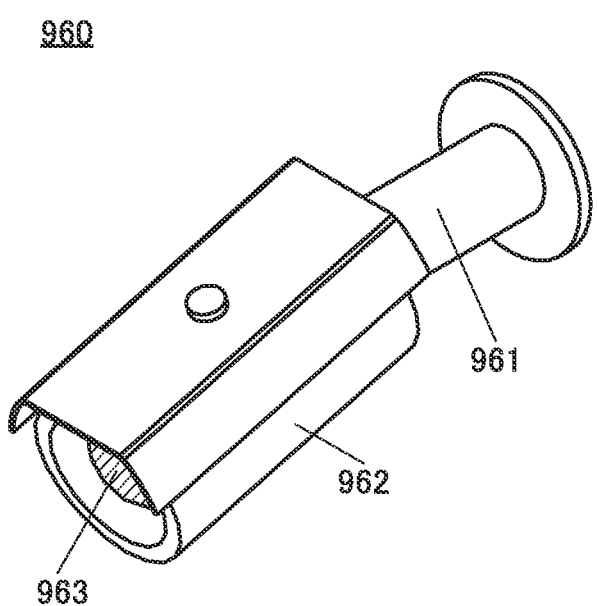

FIG. 16(F) is an example of a surveillance camera 960, which includes a fixture 961, a housing 962, a lens 963, and the like. The surveillance camera 960 can be mounted on a wall, a ceiling, or the like with the fixture 961. Note that a surveillance camera is a name in common use and does not limit the use thereof. A device that has a function of a surveillance camera can also be called a camera or a video camera, for example.

The imaging device of one embodiment of the present invention and an operation method thereof can be applied to components for acquiring imaging data in the surveillance camera 960. Consequently, the surveillance camera 960 can acquire high-quality imaging data.

This embodiment can be combined with the description of other embodiments as appropriate.

REFERENCE NUMERALS

10: pixel, 11: photoelectric conversion element, 12: transistor, 13: transistor, 14: capacitor, 15: transistor, 16: current source, 22: wiring, 23: wiring, 24: wiring, 25: wiring, 31: wiring, 33: wiring, 35: wiring, 36: wiring, 41: imaging portion, 42: gate driver circuit, 44: signal generation circuit, 45: CDS circuit, 46: data driver circuit, 47: A/D converter circuit, 48: power supply circuit, 49: optical sensor, 50: detection circuit, 101: substrate, 103a: layer, 103b: layer, 103c: layer, 104a: layer, 104b: layer, 104c: layer, 104d: layer, 105: region, 107: conductive layer, 109: insulating layer, 111: back gate electrode, 113: channel formation region, 115: conductive layer, 117: conductive layer, 119: conductive layer, 121: conductive layer, 123: insulating layer, 125: insulating layer, 127: conductive layer, 131: layer, 132: layer, 133: layer, 180: insulating layer, 181: light-blocking layer, 182: organic resin layer, 183: color filter, 183a: color filter, 183b: color filter, 183c: color filter, 184: microlens array, 185: photoelectric conversion layer, 186: insulating layer, 201: gate electrode, 202: gate insulating film, 203: source region, 204: drain region, 205: source electrode, 206: drain electrode, 207: metal oxide layer, 207a: metal oxide layer, 207b: metal oxide layer, 207c: metal oxide layer, 410: package substrate, 411: package substrate, 420: cover glass, 421: lens cover, 430: adhesive, 435: lens, 440: bump, 441: land, 442: through hole, 450: image sensor chip, 451: image sensor chip, 460: electrode pad, 461: electrode pad, 470: wire, 471: wire, 490: IC chip, 910: cellular phone, 911: housing, 912: display portion, 913: operation button, 914: external connection port, 915: speaker, 916: connector, 917: camera, 918: earphone jack, 920: portable data terminal, 921: housing, 922: display portion, 923: speaker, 924: camera, 930: information terminal, 931: housing/wristband, 932: display portion, 933: operation button, 934: external connection port, 935: camera, 940: video camera, 941: housing, 942: housing, 943: display portion, 944: operation key, 945: lens, 946: hinge, 947: speaker, 948: microphone, 950: digital camera, 951: housing, 952: shutter button, 953: light-emitting portion, 954: lens, 960: surveillance camera, 961: fixture, 962: housing, and 963: lens.

The invention claimed is:

1. An operation method of an imaging device comprising a pixel;
   wherein the pixel includes a photoelectric conversion element, a first transistor, a second transistor, and a capacitor,
   wherein one electrode of the photoelectric conversion element is electrically connected to one of a source and a drain of the first transistor,
   wherein the other of the source and the drain of the first transistor is electrically connected to a gate of the second transistor,
   wherein the gate of the second transistor is electrically connected to one electrode of the capacitor,
   writing imaging data corresponding to illuminance of light delivered to the photoelectric conversion element to the pixel by supplying a first potential to the other electrode of the capacitor and setting the first transistor in an on state in the first period, and
   reading the imaging data from the pixel by supplying a second potential to the other electrode of the capacitor in a second period.

2. The operation method of an imaging device according to claim 1,
   wherein the second transistor is in an off state in the first period, and
   wherein the second transistor is in an on state in the second period.

3. The operation method of an imaging device according to claim 1,
   wherein the second transistor is an n-channel transistor, and
   wherein the second potential is higher than the first potential.

4. The operation method of an imaging device according to claim 1,
   wherein the second transistor is a p-channel transistor, and
   wherein the second potential is lower than the first potential.

5. An operation method of an imaging device comprising a pixel;
- wherein the pixel includes a photoelectric conversion element, a first transistor, a second transistor, a third transistor, and a capacitor,
- wherein one electrode of the photoelectric conversion element is electrically connected to one of a source and a drain of the first transistor,
- wherein the other of the source and the drain of the first transistor is electrically connected to a gate of the second transistor,
- wherein the gate of the second transistor is electrically connected to one of a source and a drain of the third transistor,
- wherein the one of the source and the drain of the third transistor is electrically connected to one electrode of the capacitor,
- resetting a gate potential of the second transistor by setting the third transistor in an on state in a first period,
- writing imaging data corresponding to illuminance of light delivered to the photoelectric conversion element to the pixel by supplying a first potential to the other electrode of the capacitor and setting the first transistor in an on state and the third transistor in an off state in a second period, and
- reading the imaging data from the pixel by supplying a second potential to the other electrode of the capacitor in a third period.

6. The operation method of an imaging device according to claim 5,
- wherein the second transistor is in an off state in the first and second periods, and
- wherein the second transistor is in an on state in the third period.

7. The operation method of an imaging device according to claim 5,
- wherein the second transistor is an n-channel transistor, and
- wherein the second potential is higher than the first potential.

8. The operation method of an imaging device according to claim 5,
- wherein the second transistor is a p-channel transistor, and
- wherein the second potential is lower than the first potential.

9. The operation method of an imaging device according to claim 1,
- wherein the first transistor includes a metal oxide in a channel formation region, and
- wherein the metal oxide includes In, Zn, and M, M being Al, Ti, Ga, Sn, Y, Zr, La, Ce, Nd, or Hf.

10. The operation method of an imaging device according to claim 5,
- wherein the first transistor includes a metal oxide in a channel formation region, and
- wherein the metal oxide includes In, Zn, and M, M being Al, Ti, Ga, Sn, Y, Zr, La, Ce, Nd, or Hf.

* * * * *